(12) United States Patent
Okamura et al.

(10) Patent No.: US 8,473,823 B2
(45) Date of Patent: Jun. 25, 2013

(54) ENCODING DEVICE AND DECODING DEVICE

(75) Inventors: Shutai Okamura, Osaka (JP); Yutaka Murakami, Osaka (JP); Masayuki Orihashi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 516 days.

(21) Appl. No.: 12/674,896

(22) PCT Filed: Aug. 29, 2008

(86) PCT No.: PCT/JP2008/002368
§ 371 (c)(1),
(2), (4) Date: Feb. 23, 2010

(87) PCT Pub. No.: WO2009/028207
PCT Pub. Date: Mar. 5, 2009

(65) Prior Publication Data
US 2011/0138258 A1    Jun. 9, 2011

(30) Foreign Application Priority Data

Aug. 30, 2007 (JP) .................. 2007-224622
Aug. 28, 2008 (JP) .................. 2008-219825

(51) Int. Cl.
  *G11C 29/00*   (2006.01)
(52) U.S. Cl.
  USPC ............ 714/780; 714/758; 714/792
(58) Field of Classification Search
  USPC .............. 714/780, 758, 755, 792, 721
  See application file for complete search history.

(56) References Cited

U.S. PATENT DOCUMENTS

| 7,689,888 B2 * | 3/2010 | Kan et al. | 714/758 |
| 7,817,753 B2 * | 10/2010 | Abe et al. | 375/340 |
| 2006/0120488 A1 * | 6/2006 | Heiman et al. | 375/341 |

FOREIGN PATENT DOCUMENTS

| JP | 2002-076923 A | 3/2002 |
| JP | 2002-313035 A | 10/2002 |

OTHER PUBLICATIONS

Felström, A.J., and K.S. Zigangirov, "Time-Varying Periodic Convolutional Codes with Low-Density Parity-Check Matrix," IEEE Transactions on Information Theory 45(6): 2181-2191, Sep. 1999.
International Search Report, mailed Oct. 7, 2008, issued in corresponding International Application No. PCT/JP2008/002368, filed Aug. 29, 2008.
Tanner, R.M., et al., "LDPC Block and Convolutional Codes Based on Circulant Matrices," IEEE Transactions on Information Theory 50(12): 2966-2984, Dec. 2004.

* cited by examiner

*Primary Examiner* — Fritz Alphonse
(74) *Attorney, Agent, or Firm* — Dickinson Wright PLLC

(57) ABSTRACT

An encoding device and decoding device for improving an error floor while taking advantage of the features of a convolutional code capable of encoding/decoding an information sequence with an arbitrary length are disclosed. An error correction encoding section is provided with an LDPC-CC encoder and an LDPC-BC encoder. The LDPC-CC encoder acquires an LDPC-CC code word sequence by applying LDPC-CC encoding to a transmission information sequence. The LDPC-BC encoder acquires a parity sequence by applying LDPC-BC encoding to the LDPC-CC code word sequence. The LDPC-CC encoder further applies the LDPC-CC encoding to the parity sequence.

15 Claims, 20 Drawing Sheets

$$\mathbf{H}_{[0,n]}^T = \begin{bmatrix} h_1^{(0)}(0) & \cdots & h_1^{(1)}(1) & \cdots & h_1^{(M)}(M) & \cdots & 0 & & 0 & \cdots & 0 \\ h_2^{(0)}(0) & \cdots & h_2^{(1)}(1) & \cdots & h_2^{(M)}(M) & \cdots & 0 & & 0 & \cdots & h_1^{(M)}(n) \\ 0 & \cdots & h_1^{(0)}(0) & \cdots & h_1^{(M)}(M+1) & \cdots & & & & & h_2^{(M)}(n) \\ \cdots & & h_2^{(0)}(0) & \cdots & h_2^{(M)}(M+1) & \cdots & & & & & h_1^{(0)}(n) \\ & & 0 & & \cdots & & & & \vdots & & h_2^{(0)}(n) \\ & & & & & & & & 0 & & \end{bmatrix}$$

FIG. 1 RELATED ART

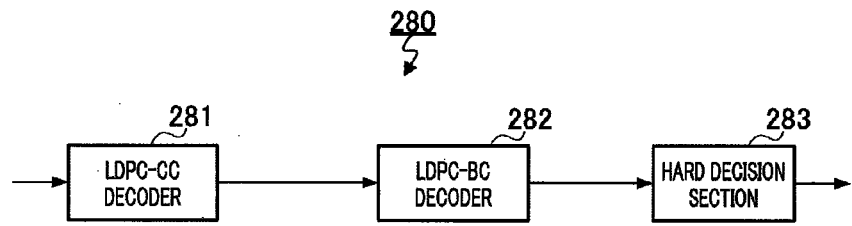
FIG.7
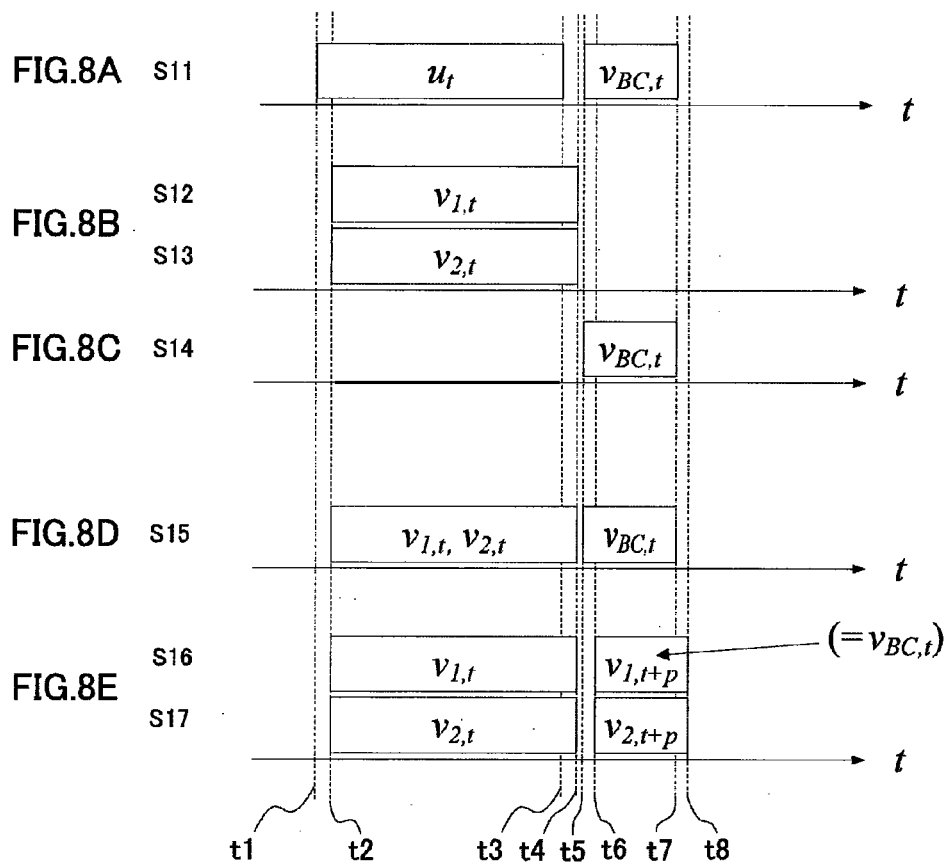
FIG.8A
FIG.8B
FIG.8C
FIG.8D
FIG.8E

FIG.9

$$\mathbf{H}_{BC} = \begin{bmatrix}
0 & 0 & 0 & - & - & - & - & - & - & - & 14 & - & 24 & - & 0 & 2 & - & 0 & - & 6 & - & - & - & - & - \\
8 & - & - & 1 & 5 & 11 & 9 & 5 & 14 & - & 24 & - & 3 & - & - & - & 7 & - & - & 8 & - & 6 & 0 & - & - \\
11 & 2 & - & - & - & 3 & - & - & - & 11 & - & - & - & - & 1 & 25 & - & 1 & - & - & 16 & 0 & 0 & - & - \\
17 & - & 16 & 13 & 14 & - & 6 & 19 & - & 8 & 3 & - & 17 & 4 & - & - & 22 & - & - & 18 & - & - & - & 24 & - \\
13 & 26 & - & - & - & - & - & - & - & - & - & 1 & - & - & 15 & - & - & 11 & - & - & - & 9 & - & - & 22 & 0 \\
0 & - & 22 & 20 & 10 & 8 & 13 & 21 & - & - & - & 14 & - & - & - & - & - & 25 & - & 2 & - & - & - & - & 8 & 0
\end{bmatrix}$$

FIG.13

$$G_{BC} = \begin{bmatrix} 1&0&0&0&0&0&0&0&0&0&0&0&0&0 \\ 0&1&0&0&0&0&0&0&0&0&0&0&0&1 \\ 1&0&1&0&0&0&1&0&0&0&0&0&0&0 \\ 0&1&0&1&0&0&0&1&0&0&0&0&0&0 \\ 0&0&1&0&1&0&0&0&0&0&1&0&0&0 \\ 0&0&0&1&0&0&0&0&0&0&0&0&0&0 \\ 0&1&0&0&0&1&1&0&0&0&0&0&0&0 \\ 0&0&0&0&0&0&0&1&0&0&0&1&0&0 \\ 0&0&0&1&0&0&0&0&1&0&0&0&0&1 \\ 1&0&0&0&0&0&0&0&0&0&0&0&0&0 \\ 1&0&0&1&0&1&0&0&0&0&1&0&0&0&0 \\ 0&0&1&0&1&0&1&0&0&0&0&0&0&1&0 \\ 1&0&0&0&0&0&0&0&1&0&0&1&0&0 \\ 0&0&1&0&0&0&0&0&0&1&0&0&1&0 \\ 0&0&0&0&1&0&0&0&1&0&0&1&0&0&1 \end{bmatrix} \updownarrow P_{BC}$$

$\longleftrightarrow K_{BC}(>2n)$

FIG.24

ENCODING DEVICE AND DECODING DEVICE

TECHNICAL FIELD

The present invention relates to a coding apparatus that performs error correction coding using convolutional codes and a decoding apparatus that decodes a coding sequence subjected to convolutional coding. For example, the present invention relates to a coding apparatus and decoding apparatus using low-density parity-check ("LDPC") codes.

BACKGROUND ART

Recently, as an error correcting code to realize high error correction performance in a feasible circuit scale, an LDPC (Low-Density Parity Check) code is popular. An LDPC code can provide high error correction performance and be implemented in a simple manner, and is therefore adopted in error correction coding schemes such as the fast wireless LAN system of IEEE802.11n and a digital broadcast system.

An LDPC code is an error correcting code defined by a low-density parity check matrix H. Here, a low density means that the number of elements of "1's" included in the matrix is greatly lower than the number of elements of "0's." That is, an LDPC code is a block code having the same block length as the number of columns N of parity check matrix H.

However, like Ethernet (trademark), most of today's communication systems have a feature of performing communication based on variable-length packets or frames. If an LDPC code, which is a block code, is applied to such systems, for example, a problem arises as to how a fixed-length LDPC code block is applied to a variable-length Ethernet (trademark) frame. Here, an LDPC code is adopted in the wireless LAN standard of IEEE802.11n. In IEEE802.11n, padding or puncturing is applied to a transmission information sequence to adjust the transmission information sequence length and the LDPC code block length. However, there is a problem that, due to padding or puncturing, the coding rate changes or redundant sequence transmission is required.

In such an LDPC code of a block code (hereinafter referred to as "LDPC-BC" (Low-Density Parity-Check Block Code)), an LDPC convolutional code (hereinafter referred to as "LDPC-CC" (Low-Density Parity-Check Convolutional Code)), which can encode and decode an information sequence of an arbitrary length, is studied (see Non-Patent Document 1).

An LDPC-CC code is a convolutional code defined by a low-density parity check matrix. As an example, FIG. 1 shows a parity check matrix $H_{[0, n]}^T$ of LDPC-CC codes of coding rate $R=\frac{1}{2}$ (=b/c). Here, "n" represents the transmission information sequence length, and "T" represents the transposed matrix.

As shown in the figure, elements $h_1^{(m)}(t)$ and $h_2^{(m)}(t)$ in parity check matrix $H_{[0, n]}^T$ are "0" or "1" (m=0, 1, ..., M). Also, all of the other elements than $h_1^{(m)}(t)$ and $h_2^{(m)}(t)$ included in parity check matrix $H_{[0,n]}^T$ are "0's" (m=0, 1, ..., M). As shown in FIG. 1, an LDPC-CC parity check matrix has a feature that "1's" are assigned only to the diagonal elements and to their nearby elements in the matrix, and "0's" are assigned to the lower left elements and upper right elements in the matrix.

Here, referring to an example of coding rate $R=\frac{1}{2}$ (=b/c), in the case of $h_1^{(0)}(t)=1$ and $h_2^{(0)}(t)=1$, an LDPC-CC coding is performed by the following equations 1 and 2 according to parity check matrix $H_{[0, n]}^T$.

[1]
$$v_{1,t} = u_t \quad \text{(Equation 1)}$$

[2]
$$v_{2,t} = \sum_{i=0}^{M} h_1^{(i)}(n)u_{t-i} + \sum_{i=1}^{M} h_2^{(i)}(n)v_{2,t-i} \quad \text{(Equation 2)}$$

Here, $u_n$ represents the transmission information sequence, and $v_{1,n}$ and $v_{2,n}$ represent the transmission codeword sequences. Also, M is the memory length in the LDPC-CC code.

FIG. 2 shows an example of an LDPC-CC encoder that implements equations 1 and 2. As shown in FIG. 2, LDPC-CC encoder 10 is provided with shift registers 11-1 to 11-M and 14-1 to 14-M, weight multipliers 12-0 to 12-M and 13-0 to 13-M, weight control section 14 and mod 2 (i.e. exclusive OR calculation) adder 15.

Shift registers 11-1 to 11-M and shift registers 14-1 to 14-M hold $v_{1,t-i}$ and $v_{2,t-i}$ (i=0, ..., M), respectively, transmit held values to the right neighboring shift registers at the timing the next input is received, and hold the values transmitted from the left neighboring shift registers.

Weight multipliers 12-0 to 12-M and 13-0 to 13-M switch the values of $h_1^{(m)}$ and $h_2^{(m)}$ between 0 and 1 (m=0, 1, ..., M), based on control signals outputted from weight control section 14. Weight control section 14 transmits the values of $h_1^{(m)}$ and $h_2^{(m)}$ at a timing to weight multipliers 12-0 to 12-M and 13-0 to 13-M, based on a built-in parity check matrix. By performing mod 2 addition (i.e. exclusive OR calculation) of the output results of weight multipliers 12-0 to 12-M and 13-0 to 13-M, mod 2 adder 15 calculates $v_{2,t-1}$.

By employing such a configuration, LDPC-CC encoder 10 can perform LDPC coding according to a parity check matrix.

Thus, an LDPC-CC encoder can be configured only with shift registers, adders and weight multipliers, and therefore has a feature that this encoder can be realized with a very simple circuit. Also, an LDPC-CC code is a kind of a convolutional code, so that it is not necessary to encode a transmission information sequence divided per fixed-length block, and it is possible to encode an information sequence of an arbitrary length.

Like LDPC-BC, it is possible to apply the sum-product algorithm to LDPC-CC decoding based on parity check matrix H. Therefore, a decoding algorithm based on maximum likelihood sequence estimation such as the Viterbi algorithm needs not be used, so that it is possible to complete decoding processing with low processing delay. Further, in Non-Patent Document 1, a decoding algorithm is proposed utilizing the shape of a parity check matrix in which "1's" are provided only near the diagonal elements in the matrix.

Non-Patent Document 1: Alberto Jimenez Felstorom, and Kamil Sh. Zigangirov, "Time-Varying Periodic Convolutional Codes With Low-Density Parity-Check-Matrix", IEEE Transactions on Information Theory, Vol. 45, No. 6, pp. 2181-2191, September 1999.

DISCLOSURE OF INVENTION

Problems to be Solved by the Invention

However, as described above, elements (weights) having a value of "1" are distributed only near the diagonal elements in a parity check matrix. Consequently, compared to an LDPC- BC code that can use a parity check matrix in which weighs are distributed over the whole block length in a random manner, there is a feature that the minimum distance in an LDPC-CC codeword is short. Therefore, the decoded bit error rate performance of an LDPC-CC tends to have the error floor of a high error rate.

It is therefore an object of the present invention to provide a coding apparatus and decoding apparatus that can improve the error floor by using features of an encodable and decodable convolutional code for an information sequence of an arbitrary length.

Means for Solving the Problem

The coding apparatus of the present invention employs a configuration having: a convolutional coding section that acquires a convolutional codeword sequence by performing convolutional coding of an input sequence; and a block coding section that acquires a parity sequence by performing block coding of the convolutional codeword sequence and outputs the parity sequence to the convolutional coding section.

With this configuration, even if error that is difficult to correct by decoding processing for convolutional codes remains, the decoding side can correct the error by decoding processing for block codes, so that it is possible to improve the error floor by using features of an encodable and decodable convolutional code for an information sequence of an arbitrary length.

An aspect of the decoding apparatus of the present invention employs a configuration having: a convolutional decoding section that acquires a decoding sequence by performing convolutional decoding of an input sequence; and a block decoding section that performs block decoding of the decoding sequence.

With this configuration, when the coding side further performs convolutional coding of a parity sequence acquired by performing block coding of a convolutional coding sequence of a transmission information sequence, even if error that is difficult to correct by decoding processing for convolutional codes remains, the decoding side can correct the error by decoding processing for block codes, so that it is possible to improve the error floor by using features of an encodable and decodable convolutional code for an information sequence of an arbitrary length.

Advantageous Effect of the Invention

According to the present invention, using features of an encodable and decodable convolutional code for an information sequence of an arbitrary length, it is possible to improve the error floor.

BRIEF DESCRIPTION OF DRAWINGS

FIG. 1 shows an example of an LDPC-CC parity check matrix;
FIG. 7 is a block diagram showing a configuration example of an LDPC decoding section according to Embodiment 1;
FIG. 8 illustrates timings of operations in an LDPC encoding section;
FIG. 9 shows an example of a parity check matrix stored in a parity check matrix storage section;
FIG. 13 shows an example of a structural LDPC code;
FIG. 24 shows an example of a generation matrix according to Embodiment 3 of the present invention.

BEST MODE FOR CARRYING OUT THE INVENTION

Embodiments of the present invention will be explained below in detail with reference to the accompanying drawings.

Embodiment 1

The present embodiment will explain an LDPC encoder and LDPC decoder that provide an effect of a concatenated code effect and improve the error floor by further applying LDPC-BC coding to a codeword sequence subjected to LDPC-CC coding.

(The Overall Configuration of a Transmitting Apparatus)

Figure 3:
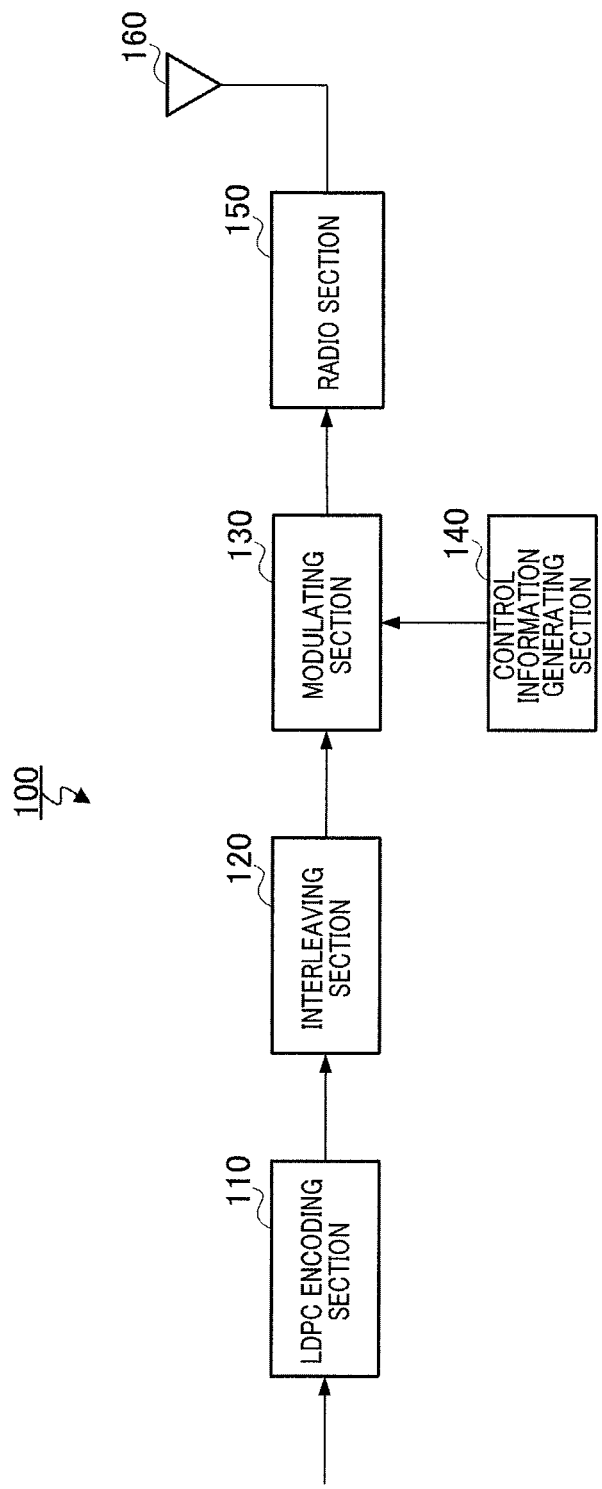
FIG. 3 is a block diagram showing the configuration of a transmitting apparatus according to Embodiment 1 of the present invention.

FIG. 3 shows the configuration of a transmitting apparatus according to the present embodiment. Transmitting apparatus 100 in FIG. 3 is provided with LDPC encoding section 110, interleaving section 120, modulating section 130, control information generating section 140, radio section 150 and transmission antenna 160.

LDPC encoding section 110 performs error correction coding processing of a transmission information sequence and outputs the resulting transmission codeword sequence to interleaving section 120.

Interleaving section 120 performs sequence order rearrangement processing (i.e. interleaving) of the transmission codeword sequence and outputs the interleaved transmission codeword sequence to modulating section 130.

Modulating section 130 modulates the interleaved transmission codeword sequence by a modulation scheme such as PSK (Phase Shift Keying) and QAM (Quadrature Amplitude-Modulation), and outputs the transmission modulation symbol sequence to radio section 150.

Control information generating section 140 generates control information, which is needed to receive a signal between the transmitting apparatus and the receiving apparatus, and outputs the control information to modulating section 130. Examples of control information include the modulation scheme, the transmission information sequence length and the preamble signal for time and frequency synchronization.

Radio section 150 generates an RF transmission signal by performing radio modulation processing such as D/A (Digital-to-Analog) conversion, frequency conversion and RF (Radio Frequency) filter processing on the transmission modulation symbol sequence.

Transmission antenna 160 transmits the RF transmission signal.

(The Configuration of an LDPC Encoding Section)

Figure 4:
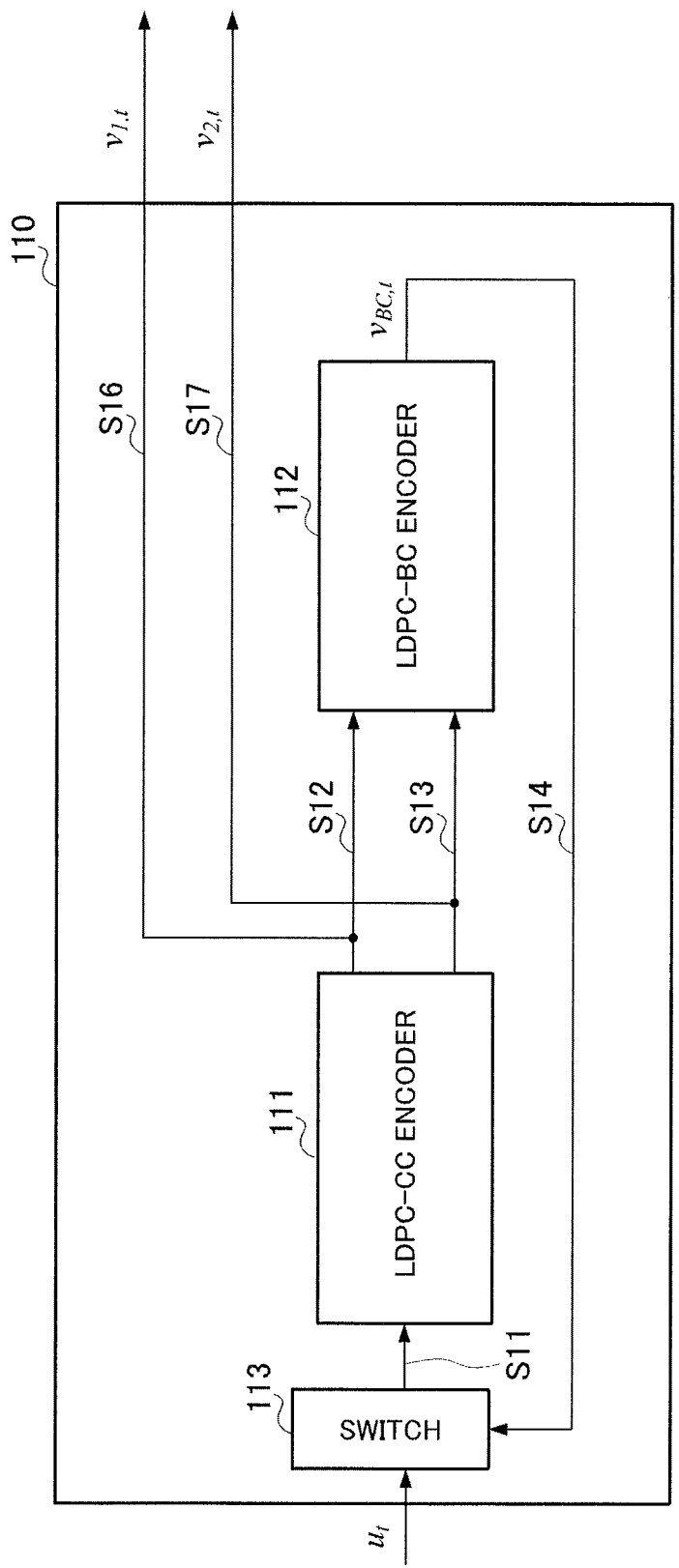
FIG. 4 is a block diagram showing a configuration example of an LDPC encoding section according to Embodiment 1.

FIG. 4 shows a configuration example of an LDPC encoding section. LDPC encoding section 110 in FIG. 4 is provided with LDPC-CC encoder 111, LDPC-BC encoder 112 and switch 113.

Figure 2:
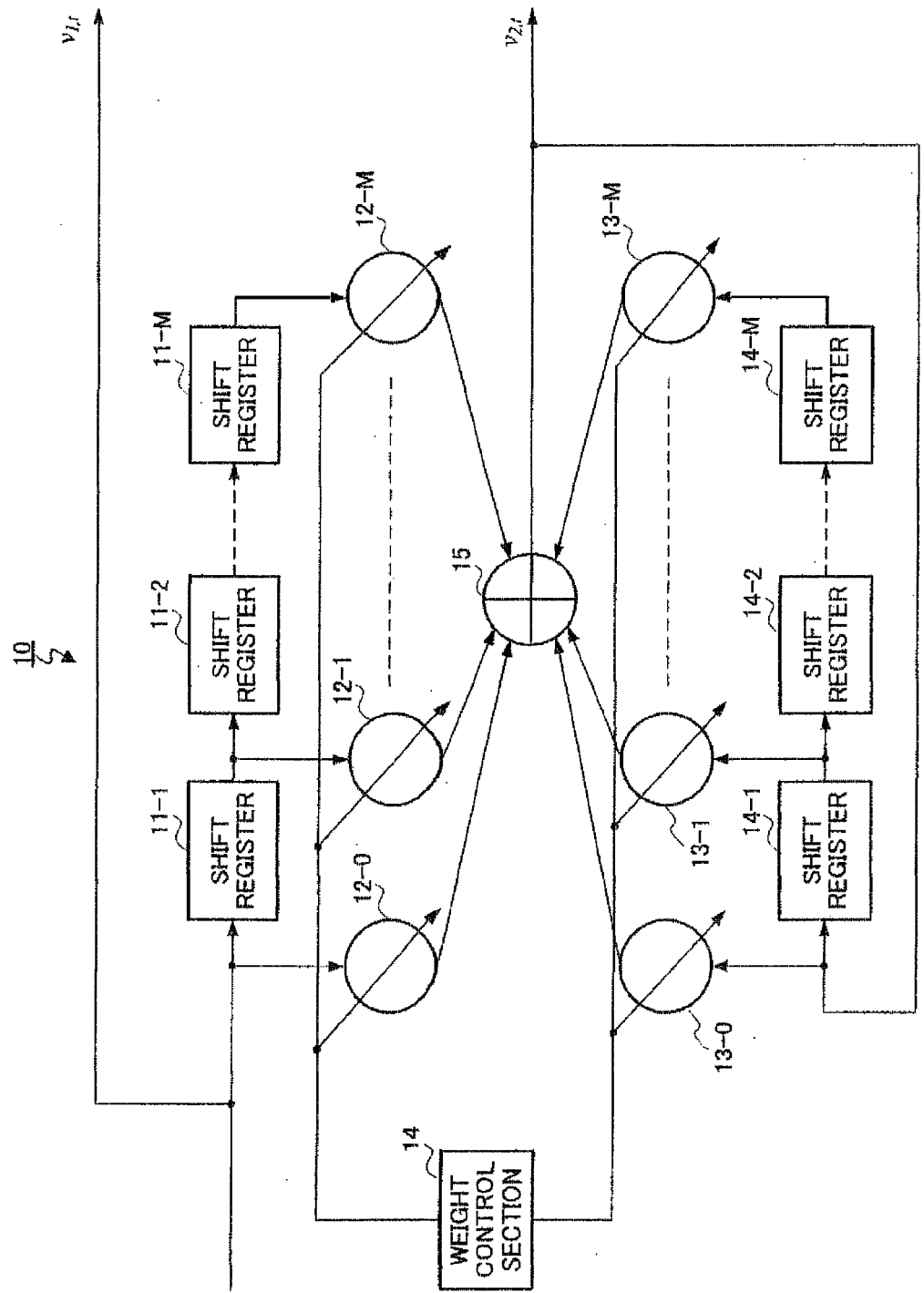
FIG. 2 is a block diagram showing a configuration example of an LDPC-CC encoder.

LDPC-CC encoder 111 applies LDPC-CC coding to an input sequence. The configuration of the LDPC-CC encoder is the same as in FIG. 2, and its configuration example in the case of coding rate R=½ has been already shown in FIG. 2, and therefore explanation will be omitted. LDPC-CC encoder 111 outputs the encoded transmission codeword sequences $v_{1,t}$ and $v_{2,t}$ to interleaving section 120 and LDPC-BC encoder 112.

LDPC-BC encoder 112 applies LDPC-BC coding processing to the transmission codeword sequences $v_{1,t}$ and $v_{2,t}$ outputted from LDPC-CC encoder 111, and outputs the resulting parity sequence $v_{BC,t}$ to switch 113.

Switch 113 outputs a transmission information sequence $u_t$ of a predetermined length to LDPC-CC encoder 111 and outputs the parity sequence $v_{BC,t}$ outputted from LDPC-BC encoder 112, to LDPC-CC encoder 111.

(The Configuration of an LDPC-BC Encoder)

Figure 5:
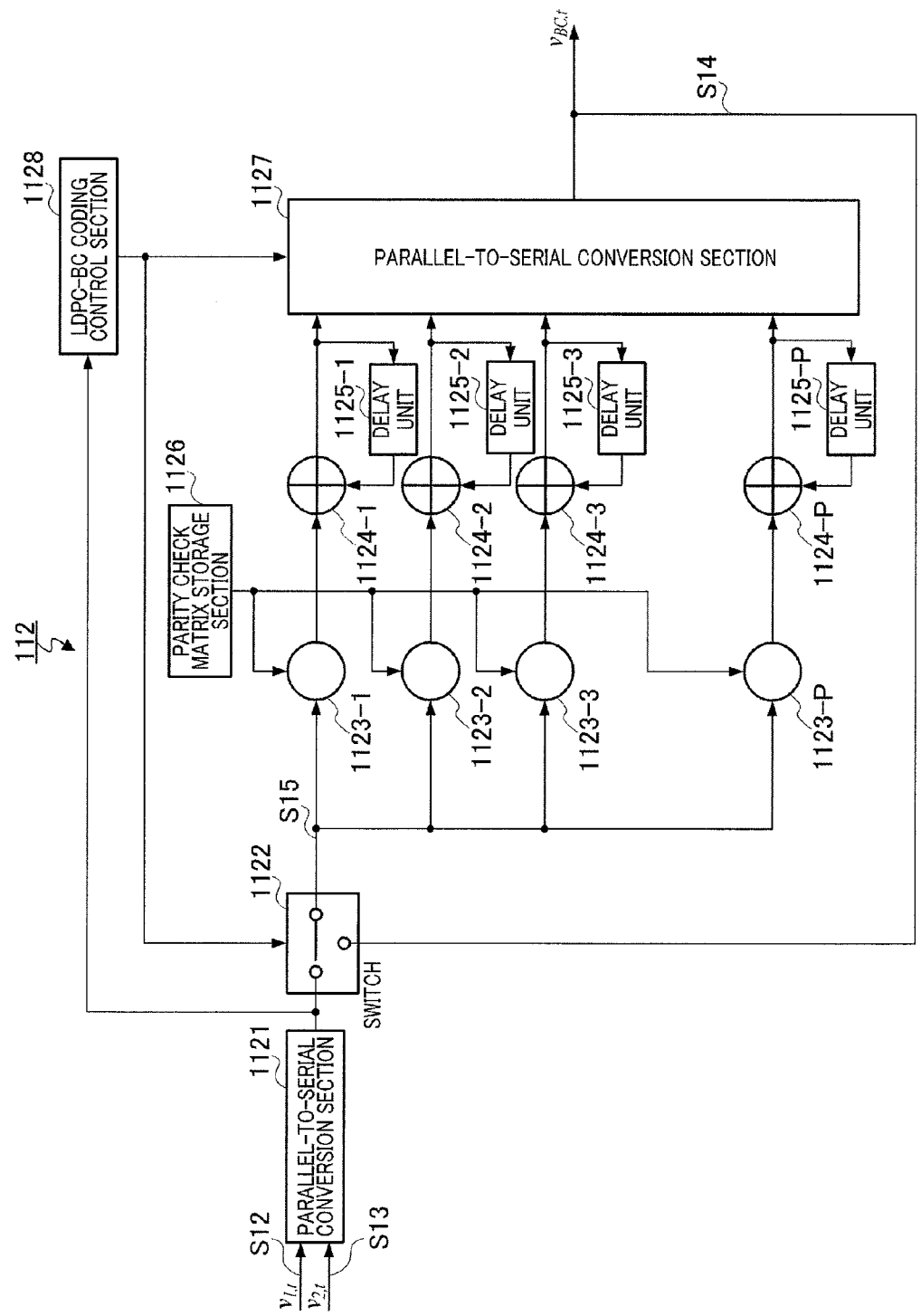
FIG. 5 is a block diagram showing a configuration example of an LDPC-BC encoder according to Embodiment 1.

FIG. 5 shows a configuration example of an LDPC-BC encoder. LDPC-BC encoder 112 in FIG. 5 is provided with parallel-to-serial conversion section 1121, switch 1122, weight multiplying sections 1123-1 to 1123-P, adders 1124-1 to 1124-P, delay units 1125-1 to 1125-P, parity check matrix storage section 1126, parallel-to-serial conversion section 1127 and LDPC-BC coding control section 1128.

Parallel-to-serial conversion section 1121 converts transmission codeword sequences $v_{1,t}$ and $v_{2,t}$ subjected to LDPC-CC coding and outputted in parallel from LDPC-CC encoder 111, into a serial sequence, and outputs the sequence to switch 1122.

Switch 1122 outputs the transmission codeword sequence $v_{1,t}$, $v_{2,t}$ or LDPC-BC parity sequence $v_{BC,t}$ to weight multiplying sections 1123-1 to 1123-P, according to an information and parity switch signal that is outputted from LDPC-BC coding control section 1128.

Weight multiplying sections 1123-1 to 1123-P multiply input bits by a weight of 1 or 0 according to the positions of parity check matrix weights stored in parity check matrix storage section 1126. Here, weight multiplying sections 1123-1 to 1123-P may employ a configuration of directly multiplying input bits by 1 or 0, or employ a configuration of outputting an input bit to a later stage in the case of a weight of 1 or outputting 0 in the case of a weight of 0, regardless of input bits.

Adders 1124-1 to 1124-P perform mod 2 addition (i.e. exclusive OR calculation) of the bits outputted from weight multiplying sections 1123-1 to 1123-P and bits outputted from delay units 1125-1 to 1125-P, and output the results to parallel-to-serial conversion section 1127.

Delay units 1125-1 to 1125-P delay input bits by one bit and output the results to adders 1124-1 to 1124-P.

Parity check matrix storage section 1126 stores parity check matrix $H_{BC}$ for LDPC-BC and outputs a weight of 1 or 0 to weight multiplying sections 1123-1 to 1123-P depending on time.

Parallel-to-serial conversion section 1127 accumulates in parallel the parity bits that are output results of adders 1124-1 to 1124-P, converts the P accumulated parity bits into serial and outputs the result to switch 1122 and switch 113 as a serial parity sequence $v_{BC,p}$. Here, parallel-to-serial conversion section 1127 switches between the timing of accumulating parity bits and the timing of outputting the accumulated parity bits in serial, depending on a command signal from LDPC-BC coding control section 1128.

LDPC-BC coding control section 1128 outputs an information and parity switch signal to switch 1122 and parity check matrix storage section 1126 based on the sequence length of an LDPC-CC codeword sequence, and outputs a command signal to parallel-to-serial conversion section 1127. Here, LDPC-BC coding control section 1128 acquires in advance the value of "n" corresponding to a transmission codeword sequence length, from the system and so on.

To be more specific, LDPC-BC coding control section 1128 outputs an information and parity switch signal and command signal at the timing of receiving as input the LDPC-CC codeword sequence ($v_{1,0}$, $v_{2,0}$) of the transmission information sequence. The information and parity switch signal outputted at that timing commands switch 1122 to output the output signals of parallel-to-serial conversion section 1121 (i.e. S12 and S13) as S15. Further, the information and parity switch signal outputted at that timing commands parity check matrix storage section 1126 to output the systematic part of the parity check matrix $H_{BC}$ shown in FIG. 9, that is, to output weights in order from the first column of $H_{BCs}$. Further, the command signal outputted at that timing commands parallel-to-serial conversion section 1127 to accumulate parity bits.

LDPC-BC coding control section 1128 counts the LDPC-CC codeword sequence ($v_{1,t}$, $v_{2,t}$) of the transmission information sequence.

Next, LDPC-BC coding control section 1128 switches an information and parity switch signal and a command signal at the timing the LDPC-CC codeword sequence of the transmission information sequence has been received as input (i.e. at the timing $v_{1,n}$, $v_{2,n}$ has been received as input or at the timing the count value reaches the sequence length of the LDPC-CC codeword sequence), outputs the switched information and parity switch signal to switch 1122 and parity check matrix storage section 1126, and outputs the switched command signal to parallel-to-serial conversion section 1127.

The switched information and parity switch signal commands switch 1122 to output the output signal of parallel-to-serial conversion section 1127 (i.e. S14) as S15. Further, the switched information and parity switch signal commands parity check matrix storage section 1126 to output the parity bit part of the parity check matrix $H_{BC}$ shown in FIG. 9, that is, to output weights in order from the first column of $H_{BCp}$ (i.e. the ($K_{BC}$+1)-th column of $H_{BC}$), to weight multiplying sections 1123-1 to 1123-P.

Further, the switched command signal commands parallel-to-serial conversion section 1127 to convert accumulated parity bits into serial and output the result as parity sequence $v_{BC,p}$. To be more specific, LDPC-BC coding control section 1128 commands parallel-to-serial conversion section 1127 to output the output of adder 1124-1 first and subsequently output the outputs of adders 1124 in order until adder 1124-P.

With these switched information and parity switch signal and command signal, parallel-to-serial conversion section 1127 outputs a parity sequence $v_{BC,p}$ and switch 1122 outputs the parity sequence $v_{BC,p}$ to weight multiplying sections 1123-1 to 1123-P.

Thus, transmitting apparatus 100 acquires an LDPC-CC codeword sequence by applying LDPC-CC coding to a transmission information sequence in LDPC-CC encoder 111, acquires a parity sequence by applying LDPC-BC coding to the LDPC-CC codeword sequence in LDPC-BC encoder 112, and further applies LDPC-CC coding to the parity sequence in LDPC-CC encoder 111.

(The Overall Configuration of the Receiving Apparatus)

Figure 6:
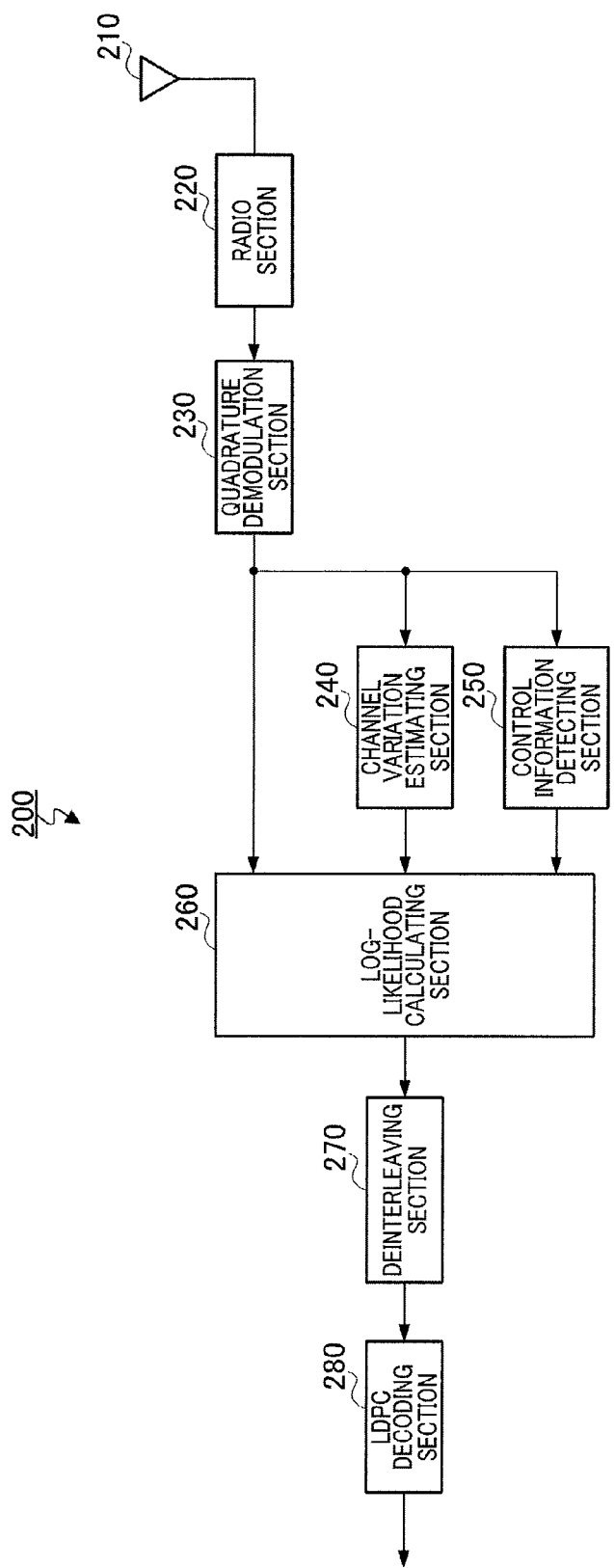
FIG. 6 is a block diagram showing the configuration of a receiving apparatus according to Embodiment 1.

FIG. 6 shows the configuration of a receiving apparatus according to the present embodiment. Receiving apparatus 200 in FIG. 6 is provided with reception antenna 210, radio section 220, quadrature demodulation section 230, channel variation estimating section 240, control information detecting section 250, log-likelihood calculating section 260, deinterleaving section 270 and LDPC decoding section 280.

Reception antenna 210 receives an RF transmission signal transmitted from transmitting apparatus 100 and outputs the signal to radio section 220.

Radio section 220 performs radio demodulation processing such as RF filter processing, frequency conversion and A/D (Analog-to-Digital) conversion, and outputs a received signal subjected to radio demodulation processing to quadrature demodulation section 230.

Quadrature demodulation section 230 detects baseband signals of the I channel and the Q channel from the received signal subjected to radio demodulation processing, and outputs the detected baseband signals to channel variation estimating section 240, control information detecting section 250 and log-likelihood calculating section 260.

Channel variation estimating section 240 uses known signals included in the baseband signals to estimate channel variation in a radio channel between transmitting apparatus 100 and receiving apparatus 200, and outputs the estimation result to log-likelihood calculating section 260.

Also, control information detecting section 250 detects control signals included in the baseband signals and outputs the control signals to log-likelihood calculating section 260.

Log-likelihood calculating section 260 calculates the log-likelihood ratio of each of transmitted codeword bits and outputs the results to deinterleaving section 270.

Deinterleaving section 270 rearranges the order in the log-likelihood ratio sequence using opposite processing to the rearrangement processing performed in interleaving section 120 of transmitting apparatus 100.

LDPC decoding section 280 performs error correction decoding using the log-likelihood ratio sequence, and outputs the hard decision value of the decoding result.

(The Configuration of an LDPC Decoding Section)

FIG. 7 shows a configuration example of an LDPC decoding section. LDPC decoding section 280 in FIG. 7 is provided with LDPC-CC decoding section 281, LDPC-BC decoding section 282 and hard decision section 283.

LDPC-CC decoding section 281 performs LDPC-CC decoding processing based on LDPC-CC parity check matrix $H_{cc}$, for a received log-likelihood sequence outputted from deinterleaving section 270. Non-Patent Document 1 discloses specific LDPC-CC decoding processing, and therefore explanation will be omitted. LDPC-CC decoder 281 outputs a CC-decoded soft decision value acquired by LDPC-CC decoding processing, to LDPC-BC decoder 282.

LDPC-BC decoder 282 performs LDPC-BC decoding processing based on LDPC-BC parity check matrix $H_{BC}$, for the CC-decoded soft decision value outputted from LDPC-CC decoder 281. LDPC-BC decoding processing can be implemented using a decoding algorithm such as belief propagation decoding and sum-product decoding, and therefore its explanation will be omitted.

LDPC-BC decoder 282 outputs the BC-decoded soft decision value after LDPC-BC decoding to hard decision section 283.

Hard decision section 283 performs a hard decision of the BC-decoded soft decision value and acquires a reception information sequence.

Thus, receiving apparatus 200 acquires a CC-decoded soft decision value by applying LDPC-CC decoding to a reception log-likelihood ratio sequence in LDPC-CC decoder 281. Next, receiving apparatus 200 acquires a BC-decoded soft decision value by applying LDPC-BC decoding to the CC-decoded soft decision value in LDPC-BC decoder 282. Next, receiving apparatus 200 acquires a reception information sequence by performing a hard decision of the BC-decoded soft decision value in hard decision section 283.

(Operations)

The operations of transmitting apparatus 100 formed as above, especially, the operations of LDPC encoding section 110 will be explained with reference to the timing chart in FIG. 8. Here, in FIG. 8, the codes assigned to the sequences (i.e. S11 to S17) shown in FIG. 4 and FIG. 5 are used.

First, transmission information sequence $u_t$ ($t=1, \ldots, n$) is received as input in LDPC encoding section 110 and then received as input in LDPC-CC encoder 111 via switch 113. Here, subscript "t" of transmission information sequence $u_t$ represents the time, and "n" represents the time associated with the transmission information sequence length. FIG. 8A shows a case where LDPC-CC encoder 111 receives as input transmission information sequence $u_t$ as input sequence S11 during times t1 and t3.

Transmission information sequence $u_t$ is subjected to LDPC-CC coding in LDPC-CC encoder 111 of LDPC encoding section 110.

Transmission codeword sequences $v_{1,t}$ and $v_{2,t}$ (in the case of coding rate R=½) acquired by LDPC-CC coding in LDPC-CC encoder 111 are outputted to interleaving section 120 in a later stage and further outputted to LDPC-BC encoder 112. FIG. 8B shows a state where transmission codeword sequences $v_{1,t}$ and $v_{2,t}$ are outputted as output sequences S12 and S13 of LDPC-CC encoder 111 during times t2 and t4.

Parallel-to-serial conversion section 1121 in LDPC-BC encoder 112 converts the transmission codeword sequences $v_{1,t}$ and $v_{2,t}$ received as input in parallel into serial, and outputs the transmission codeword sequence $v_{1,t}$, $v_{2,t}$ subjected to serial conversion to switch 1122.

If time "t" is equal to or less than "n," that is, if the transmission codeword sequence $v_{1,t}$, $v_{2,t}$ is received as input (hereinafter this time is referred to as a "systematic coding period"), LDPC-BC coding control section 1128 controls switch 1122 to output the transmission codeword sequence $v_{1,t}$, $v_{2,t}$ to weight multiplying sections 1123-1 to 1123-P. In the example shown in FIG. 8, times t2 to t4 corresponds to the "systematic coding period." Also, FIG. 8D shows a case where the transmission codeword sequence $v_{1,t}$, $v_{2,t}$ subjected to serial conversion is outputted as output sequence S15 of switch 1122 during times t2 to t4. In this case, the same transmission codeword is transmitted to weight multiplying sections 1123-1 to 1123-P. Also, LDPC-BC coding control section 1128 acquires in advance time "n" associated with the transmission codeword sequence length.

Weight multiplying sections 1123-1 to 1123-P multiply the transmission codeword sequence $v_{1,t}$, $v_{2,t}$ by 1 or 0, based on a parity check matrix stored in parity check matrix storage section 1126.

Figure 9:
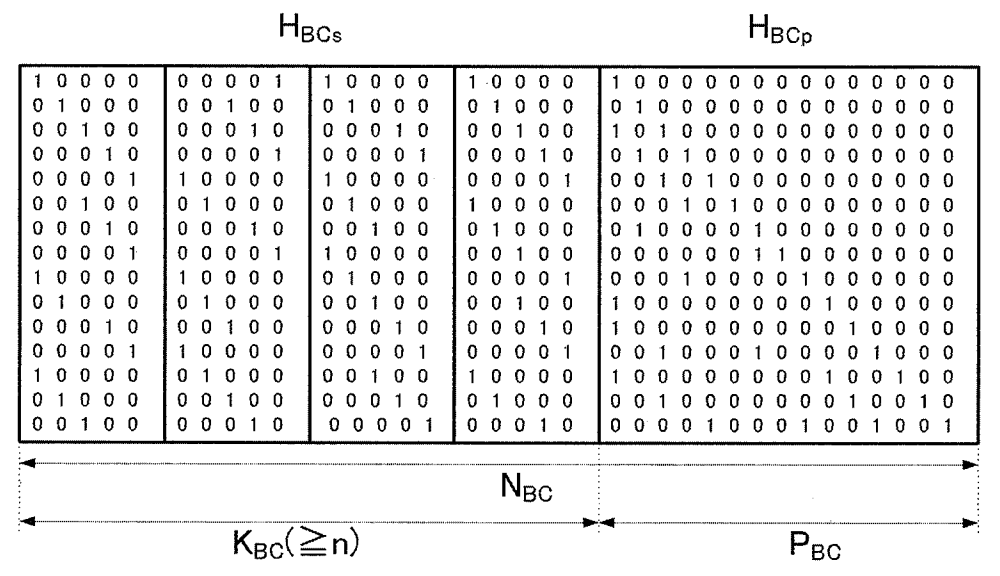

FIG. 9 shows an example of a parity check matrix. Each row of parity check matrix $H_{BC}$ shown in FIG. 9 is associated with a parity check equation of an LDPC-BC code, and each column is associated with an LDPC-BC codeword. Also, parity check matrix $H_{BC}$ is formed with two parts of $H_{BCs}$ and $H_{BCp}$. In an LDPC-BC code, $H_{BCs}$ is a submatrix of the systematic bit part, that is, the part corresponding to transmission codeword sequences $v_{1,t}$ and $v_{2,t}$ received as input. Also, $H_{BCp}$ corresponds to the parity bit part acquired by LDPC-BC coding. Further, $H_{BCp}$ is a lower triangular matrix, and a parity check matrix having such a feature is referred to as "LDGM" (Low-Density Generation-Matrix).

In the systematic coding period, the weight of each column of check submatrix $H_{BCs}$ is outputted from parity check matrix storage section 1126 to weight multiplying sections 1123-1 to 1123-P. Also, in weight multiplying sections 1123-1 to 1123-P, adders 1124-1 to 1124-P and delay units 1125-1 to 1125-P, calculations associated with parity check equations for the first to P-th rows of parity check matrix $H_{BC}$ are performed, and the results are outputted to parallel-to-serial conversion section 1127. Here, when the systematic coding period is reported from LDPC-BC coding control section 1128, parallel-to-serial conversion section 1127 accumulates the outputs of adders 1124-1 to 1124-P.

Next, a case will be explained where time "t" is greater than "n," that is, where transmission codeword sequences $v_{1,t}$ and $v_{2,t}$ from LDPC-CC coder 111 has been received as input (hereinafter referred to as "parity coding period"). In the example shown in FIG. 8, times t5 to t7 represent the "parity coding period."

In the parity coding period, LDPC-BC coding control section 1128 reports an information and parity switch signal indicating the parity coding period and a command signal to switch 1122 and parallel-to-serial conversion section 1127.

In parallel-to-serial conversion section 1127 in the parity coding period, the outputs of adders 1124-1 to 1124-P are converted in serial in order from the output of adder 1124-1 associated with the first row of parity check matrix $H_{BC}$. Also, a converted parity sequence (hereinafter "BC parity sequence") is outputted to LDPC-CC encoder 111 and switch 1122 (see FIG. 8C).

Further, in switch 1122, in the parity coding period, transmission bits that are outputted to weight multiplying sections 1123-1 to 1123-P are switched to the BC parity sequence $v_{BC,t}$ outputted from parallel-to-serial conversion section 1127, instead of the transmission codeword sequences $v_{1,t}$ and $v_2$ outputted from LDPC-CC encoder 111 (see FIG. 8D).

In the parity coding period, an information and parity switch signal is outputted from LDPC-BC coding control section 1128 to parity check matrix storage section 1126, where the information and parity switch signal gives a command to output weights to weight multiplying sections 1123-1 to 1123-P in order from the first column of $H_{BCp}$, which is the parity bit part in parity check matrix $H_{BC}$ (i.e. in order from the ($K_{BC}$+1)-th column of $H_{BC}$). Next, even when weights until the weight of the $k_{BC}$-th column of parity check matrix $H_{BC}$ are not outputted to weight multiplying sections 1123-1 to 1123-P, parity check matrix storage section 1126 can skip columns until the $K_{BC}$-th column and output the weight of the ($K_{BC}$+1)-th column to weight multiplying sections 1123-1 to 1123-P. Further, subsequently, parity check matrix storage section 1126 outputs weights to weight multiplying sections 1123-1 to 1123-P in order from the ($K_{BC}$+2)-th column, the ($K_{BC}$+3)-th column, . . . , to the $N_{BC}$-th column.

By this means, weight multiplying sections 1123-1 to 1123-P multiply bits of the BC parity bit sequence $v_{BC,t}$ (hereinafter "BC parity bits") and the weights of the parity check matrix.

Check submatrix $H_{BCp}$ is designed to be a lower triangular matrix, and, consequently, upon performing weight multiplication of the second BC parity bit, the first BC parity bit is already determined. Therefore, a series of processing in weight multiplying section 1123-1, adder 1124-1 and delay unit 1125-1 need not be performed. Subsequently, in the same way, upon performing weight multiplication of the p-th BC parity bit, it is possible to omit a series of processing in the weight multiplying section, adder and delay unit until the (p−1)-th BC parity bit.

Thus, LDPC-BC encoder 112 converts BC parity bits found as above into serial and outputs a BC parity sequence $v_{BC,t}$ to LDPC-CC encoder 111.

By this means, LDPC-CC encoder 111 connects the BC parity sequence $v_{BC,t}$ outputted from LDPC-BC encoder 112 to the end of a transmission information sequence $u_t$ and performs LDPC-CC coding (see FIG. 8A). However, LDPC-CC encoder 111 does not output transmission codeword sequence $v_{1,t+p}$, $v_{2,t+p}$ acquired by LDPC-CC coding of the BC parity sequence $v_{BC,t}$ to LDPC-BC encoder 112, and outputs the transmission codeword sequence $v_{1,t+p}$, $v_{2,t+p}$ only to interleaving section 120 (see FIG. 8E).

Also, in the parity coding period, LDPC-BC encoder 112 performs processing of switching weights that are outputted from parity check matrix storage section 1126, to weights of $H_{BCp}$ forcibly.

To be more specific, in the parity coding period, weights associated with columns of check submatrix $H_{BCp}$ are outputted from parity check matrix storage section 1126 to weight multiplying sections 1123-1 to 1123-P. Here, even when time "t" is less than $K_{BC}$, that is, even when all columns of $H_{BCs}$ have not been outputted, weights of $H_{BCp}$ are outputted from parity check matrix storage section 1126 in the parity coding period. By this means, even if the length of a transmission codeword sequence received as input is shorter than the LDPC-BC systematic block length $K_{BC}$, at the timing at which the transmission codeword sequence has been received as input, it is possible to output a parity sequence acquired by LDPC-BC coding.

The process of switching weights outputted from parity check matrix storage section 1126 forcibly to weights of $H_{BCp}$ in the parity coding period, is equivalent to the process of performing LDPC-BC coding presuming that the transmission codeword sequences acquired after time n until $K_{BC}$ are all "0's." Therefore, if decoding processing is performed based on this presumption upon decoding, the decoding performance is not degraded.

Here, in parity check matrix $H_{BC}$, assume that the size (i.e. the number of columns) of submatrix $H_{BCs}$ corresponding to the systematic part is the maximum possible value of the number of LDPC-CC codeword sequences that are transmission information sequences in a communication system including transmitting apparatus 100. By this means, it is possible to avoid a case where the number of LDPC-CC coding sequences of transmission information sequences exceeds the size of $H_{BC_s}$ and where, as a result, an LDPC-CC codeword of a transmission information sequence that is not subject to LDPC-BC coding occurs.

Thus, when a transmission codeword sequence subjected to error correction coding is outputted from LDPC encoding section 110 to interleaving section 120, interleaving section 120 interleaves the transmission codeword sequence. Next, modulating section 130 modulates the interleaved transmission codeword sequence and control information outputted from control information generating section 140. Next, a modulated modulation symbol sequence is subject to radio modulation processing in radio section 150, and a generated RF transmission signal is transmitted via transmission antenna 160.

Next, the operations of receiving apparatus 200 formed as above, especially the operations of LDPC decoding section 280, will be explained.

An RF signal transmitted from transmitting apparatus 100 is received via reception antenna 210 in receiving apparatus 200 and outputted to radio section 220.

Radio section 220 performs radio demodulation processing of the RF signal transmitted from transmitting apparatus 100, and quadrature demodulation section 230 detects baseband signals of the I channel and the Q channel.

Control information detecting section 250 detects control signals included in the baseband signals and outputs the detected control signals to log-likelihood calculating section 260.

From the baseband signals, log-likelihood calculating section 260 calculates the log-likelihood ratio of each of transmitted codeword bits. Next, deinterleaving section 270 rearranges the order in the log-likelihood ratio sequence, using rearrangement processing opposite to the processing performed in interleaving section 120 of transmitting apparatus 100. The deinterleaved reception log-likelihood sequence is outputted to LDPC-CC decoder 281 in LDPC decoding section 280.

LDPC-CC decoder 281 in LDPC decoding section 280 applies LDPC-CC decoding processing based on LDPC-CC parity check matrix $H_{cc}$ to the reception log-likelihood sequence outputted from deinterleaving section 270. LDPC-BC decoder 282 applies LDPC-BC decoding processing based on LDPC-BC parity check matrix $H_{BC}$ to the CC-decoded soft decision values outputted from LDPC-CC decoder 281.

Hard decision section 283 performs a hard decision of the BC-decoded soft decision values and acquires a reception information sequence.

Thus, LDPC decoding section 280 further applies LDPC-BC decoding processing to a soft decision value sequence after LDPC-CC decoding acquired by LDPC-CC decoding processing. This soft decision value sequence after LDPC-CC decoding corresponds to a sequence attaching a parity sequence to an LDPC-CC codeword, where the LDPC-CC codeword is acquired by performing LDPC-CC coding of a transmission information sequence and the parity sequence is acquired by performing LDPC-BC coding of the LDPC-CC codeword.

Thus, by applying LDPC-BC decoding to a soft decision value sequence after LDPC-CC decoding, even if error remains in an LDPC-CC decoding result due to the fact that the LDPC-CC minimum distance is short, it is possible to correct the error by the LDPC-BC decoding gain. As a result, it is possible to improve the error floor, which is a problem in the case of using only LDPC-CC codes.

Also, normally, when a plurality of error correction codes are subject to concatenated coding, an interleaver is required between the encoder for the first code and the encoder for a second code, and a deinterleaver is required between the decoder for the second code and the decoder for the first code. By contrast with this, an LDPC-BC code used in the present embodiment incorporates an interleaving effect for a length corresponding to a block length. Therefore, as the above configuration, by using an LDPC-BC code for one of codes subject to concatenated coding, an interleaver between encoders and a decoder between deinterleavers are not necessary.

As described above, according to the present embodiment, LDPC encoding section 110 is formed with: LDPC-CC encoder 111 that acquires an LDPC-CC codeword sequence by performing LDPC-CC coding; and LDPC-BC encoder 112 that acquires a parity sequence by performing LDPC-BC coding of the acquired LDPC-CC codeword sequence and outputs the parity sequence to LDPC-CC encoder 111, where LDPC-CC encoder 111 acquires the LDPC-CC codeword sequence by performing LDPC-CC coding of a transmission information sequence, LDPC-BC encoder 112 acquires the parity sequence by performing LDPC-BC coding of the LDPC-CC codeword sequence and LDPC-CC encoder 111 further performs LDPC-CC coding of the parity sequence.

Also, LDPC decoding section 280 is formed with: LDPC-CC decoder 281 that performs LDPC-CC decoding of an input sequence; and LDPC-BC decoder 282 that performs LDPC-BC decoding of an output sequence from LDPC-CC decoder 281, where LDPC-CC decoder 281 acquires a soft decision value after LDPC-CC decoding by performing LDPC-CC decoding of a reception log-likelihood ratio sequence and LDPC-BC encoder 282 performs LDPC-BC decoding using the soft decision value after LDPC-CC decoding.

By this means, a parity sequence is acquired by applying LDPC-BC coding to an LDPC-CC coding sequence of a transmission information sequence, and an LDPC-CC coding sequence acquired by further applying LDPC-CC coding to the parity sequence is outputted from LDPC encoding section 110. Therefore, even if error occurs as a result of performing decoding processing of an LDPC-CC coding sequence of a transmission information sequence, by further using a decoding processing result of a parity sequence for the LDPC-CC coding sequence, it is possible to perform error correction and improve the error floor.

Variation Example

Figure 10:
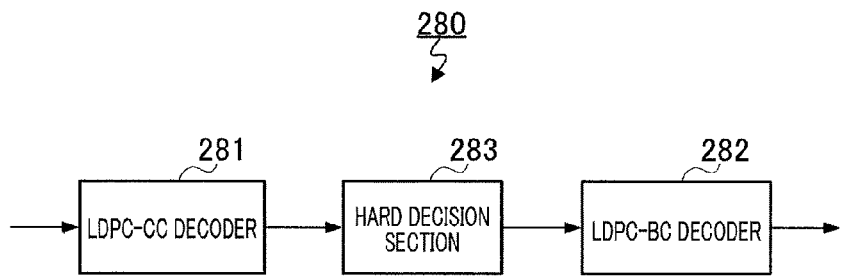
FIG. 10 is a block diagram showing another configuration example of an LDPC decoding section.

FIG. 10 shows another configuration example of an LDPC decoding section. LDPC decoding section 280 shown in FIG. 7 provides the high error correction decoding gain by using a SISO (Soft Input Soft Output) decoder in both LDPC-CC decoder 281 and LDPC-BC decoder 282. By contrast, as shown in FIG. 10, it is possible to employ a configuration where hard decision section 283 is provided between LDPC-CC decoder 281 and LDPC-BC decoder 282, and LDPC-BC decoder 282 performs LDPC-BC decoding processing by hard decision. By this means, compared to a case where LDPC-CC decoder 281 and LDPC-BC decoder 282 both adopt the SISO decoding algorithm, although the error correction decoding gain degrades, it is possible to simplify the configuration of LDPC-BC decoder 282. Further, the time required for LDPC-BC decoding processing is shortened.

Figure 11:
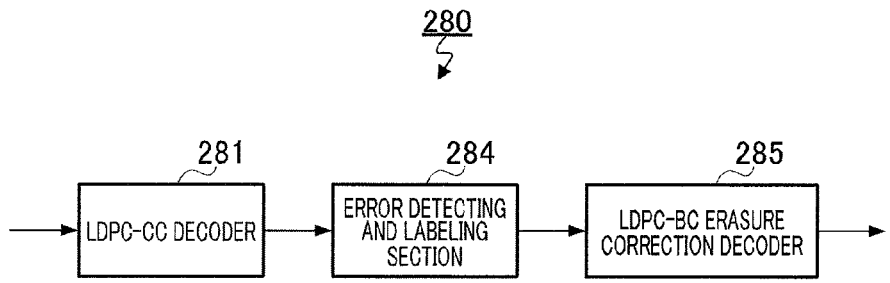
FIG. 11 is a block diagram showing another configuration example of an LDPC decoding section.

FIG. 11 shows another configuration example of an LDPC decoding section. LDPC decoding section 280 in FIG. 11 is formed with LDPC-CC decoder 281, error detecting and labeling section 284 and LDPC-BC erasure correction decoder 285.

Error detecting and labeling section 284 acquires a reception codeword sequence by performing hard decision of a CC-decoded soft decision value outputted from LDPC-CC decoder 281. Further, error detecting and labeling section 284 performs a parity check based on parity check matrix Hcc. Here, it is possible to decide whether or not a codeword subjected to LDPC-CC coding satisfies the parity check, per memory length M of an LDPC-CC code. To be more specific, in an LDPC-CC code, by using equation 3, it is possible to perform the parity check, per memory length M.

[3]

$$v_t H_0^T(t) + v_{t-1} H_1^T(t) + \ldots + v_{t-m_s} H_{m_s}^T(t) = 0 \quad \text{(Equation 3)}$$

In this case, if a reception codeword sequence per memory length M satisfies the parity check, error detecting and labeling section 284 decides no error and outputs the codewords included in the region. By contrast, if a reception codeword sequence per memory length M does not satisfy the parity check, error detecting and labeling section 284 decides error preset and outputs all of the codewords included in the region as "$\epsilon$" (erasure).

LDPC-BC erasure correction decoder 285 performs erasure correction by applying the erasure correction decoding algorithm based on LDPC-BC to a reception codeword sequence with a erasure label outputted from error detecting and labeling section 284. Further, LDPC-BC erasure correction decoder 285 outputs the reception information sequence subjected to erasure correction decoding processing.

Thus, by combining erasure correction decoding processing of an LDPC-BC code and a feature that a parity check is possible per memory length M of an LDPC-CC code, it is possible to implement decoding processing of concatenated codes with a smaller amount of calculations and shorter decoding processing time.

Figure 12:
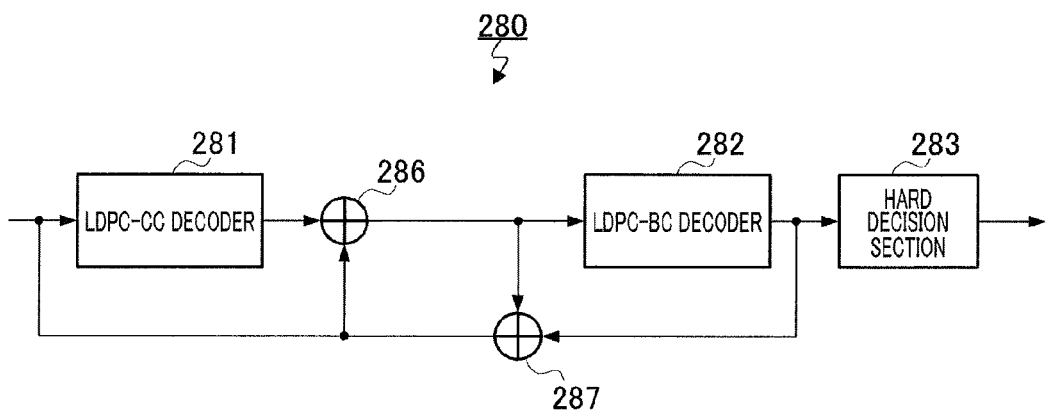
FIG. 12 is a block diagram showing another configuration example of an LDPC decoding section.

FIG. 12 shows another configuration example of an LDPC decoding section. LDPC decoding section 280 in FIG. 12 is formed with LDPC-CC decoder 281, LDPC-BC decoder 282, hard decision section 283 and subtractors 286 and 287.

First, LDPC-CC decoder 281 performs LDPC-CC decoding of a reception log-likelihood sequence outputted from deinterleaving section 270, and outputs a CC-decoded soft decision after LDPC-CC decoding processing, to subtractor 286. Next, subtractor 286 subtracts a BC-decoded extrinsic value sequence outputted from subtractor 287, from the CC-decoded soft decision value, and outputs the CC-decoded extrinsic value sequence to LDPC-BC decoder 282 and subtractor 287. Here, upon the initial LDPC-CC decoding, a sequence of all "0's" is given as a BC-decoded extrinsic value sequence.

Next, LDPC-BC decoder 282 performs LDPC-BC decoding processing using the CC-decoded extrinsic value sequence, and outputs a BC-decoded soft decision value to hard decision section 283 and subtractor 287.

Subtractor 287 subtracts the CC-decoded extrinsic value sequence from the BC-decoded soft decision value, and outputs the resulting BC-decoded extrinsic value sequence to LDPC-CC decoder 281.

LDPC-CC decoder 281 performs decoding processing again, using the BC-decoded extrinsic value sequence outputted from subtractor 287 and a reception log-likelihood ratio sequence.

After repeating this repeated decoding processing for predetermined times, hard decision section 283 acquires a reception information sequence from the hard decision value of the BC-decoded soft decision value.

Thus, by forming LDPC decoding section 280 with turbo decoding of LDPC-CC decoding and LDPC-BC decoding, it is possible to acquire the iterative decoding gain by two decoding processing, so that it is possible to improve the decoding gain and error rate performance.

Also, a case has been described above where LDPC encoding section 110 performs LDPC-BC coding using a transmission codeword sequence acquired after LDPC-CC coding. Here, upon performing LDPC-BC coding using a transmission codeword sequence after LDPC-CC coding, it is possible to lengthen the code length of an LDPC-BC code and improve LDPC-BC correction performance. Also, it is possible to adopt a decoding algorithm of the turbo decoding type shown in FIG. 12.

Also, it is possible to implement LDPC-BC coding by applying LDPC-BC coding to a transmission information sequence directly, instead of a transmission codeword sequence. That is, LDPC-CC encoder 111 acquires an LDPC-CC codeword sequence by applying LDPC-CC coding to a transmission information sequence. LDPC-BC encoder 112 acquires a parity sequence by applying LDPC-BC coding to the transmission information sequence. Also, LDPC-CC encoder 111 may further apply LDPC-CC coding to the parity sequence. In the case of applying LDPC-BC coding to a transmission information sequence directly, the number of bits encoded depends on the scale of the LDPC-BC parity check matrix, so that the number of bits encoded decreases, and it is possible to provide an advantage of reducing the amount of calculations and delay time in the coding and decoding processing.

Also, although an example case has been described above where the parity check matrix shown in FIG. 9 is used as parity check matrix $H_{BC}$ of an LDPC-BC code, the present invention is not limited to this, and it is equally possible to adopt a structured LDPC code such as a QC (Quasi Cyclic)-LDPC code and array-LDPC code. Parity check matrix $H_{BC}$ of a structured LDPC code is in a shape of arranging a plurality of identity matrixes, matrixes acquired by cyclically shifting the identity matrix for arbitrary times and zero matrixes vertically and horizontally. FIG. 13 shows an example of a structural LDPC code. Here, each element of $H_{BC}$ represents the amount of cyclic shifts of a z×z identity matrix. In the case of an element of 0, an identity matrix is provided, and, in the case of an element of 1 or greater, a matrix acquired by cyclic shifting the identity matrix to the right by the value of the element, is provided. Further, in the case of a minus element, a z×z zero matrix is provided.

Upon using such a structural LDPC code as a parity check matrix of an LDPC-BC code, it is effective to set the size "z" of the identity matrix equal to or greater than memory length M of an LDPC-CC code. Here, an LDPC-CC code is a convolutional code, and, if error occurs, the range in which that error has influence is approximately memory length M. Therefore, by forming a structural LDPC code using an identity matrix of a size greater than that length, one error in LDPC-CC code influences only one bit in the parity check equation, so that it is possible to perform error correction by LDPC-BC effectively.

Figure 14:
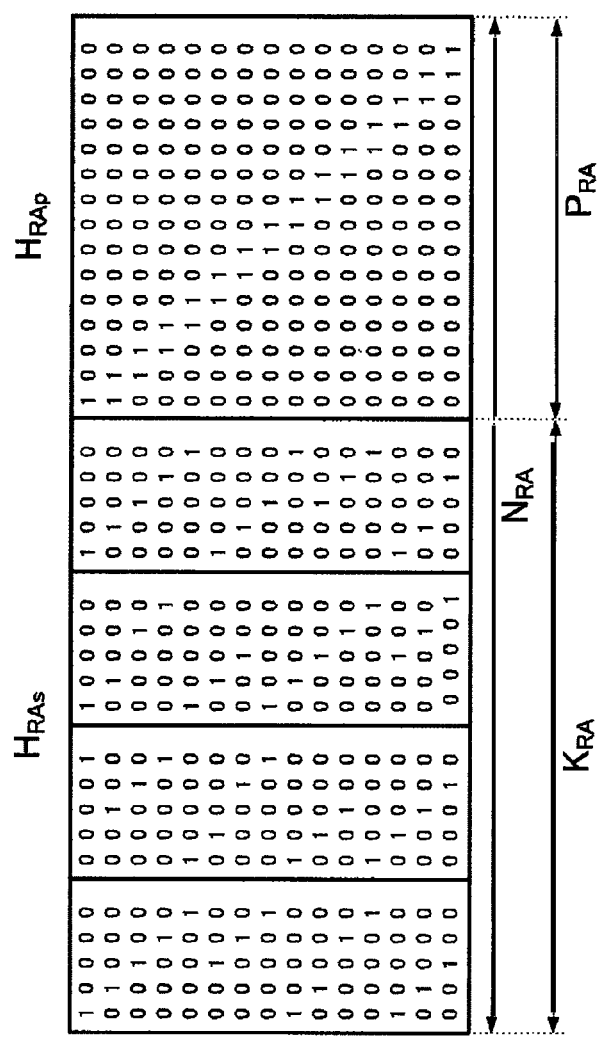
FIG. 14 shows an example of an RA code.

Also, parity check matrix $H_{BC}$ of an LDPC-BC code may be RA (Repeat-Accumulate) code. FIG. 14 shows an example of an RA code. An RA code is formed with $H_{RAs}$ corresponding to the systematic bit part and $H_{RAp}$ corresponding to the parity bit part.

Figure 15:
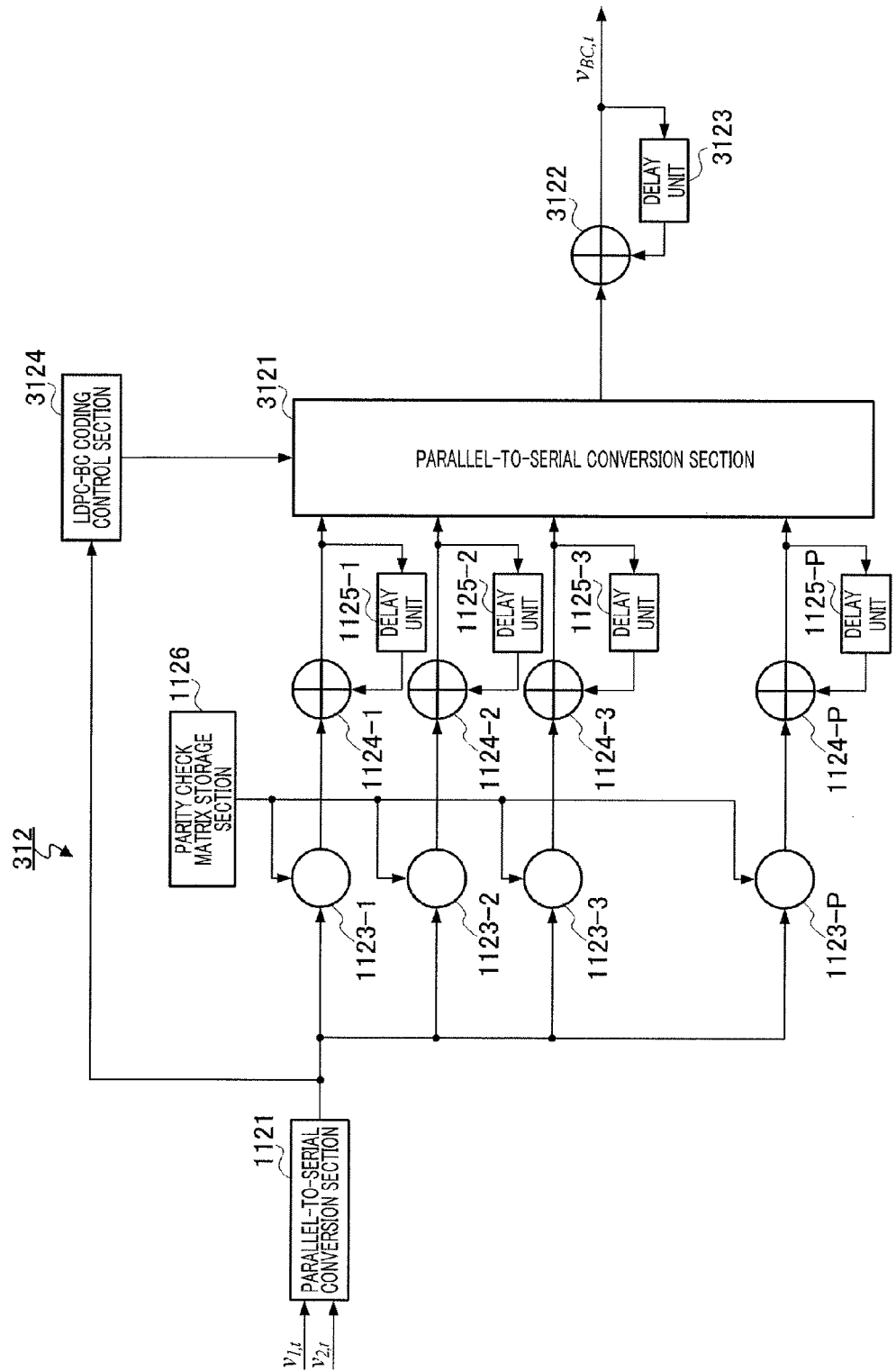
FIG. 15 is a block diagram showing a configuration example of an LDPC-BC encoder in the case of using an RA code.

FIG. 15 shows a configuration example of an LDPC-BC encoder in the case of using an RA code. Here, in LDPC-BC encoder 312 shown in FIG. 15, the same components as in LDPC-BC encoder 112 in FIG. 5 will be assigned the same reference numerals as in FIG. 5 and their explanation will be omitted. LDPC-BC encoder 312 in FIG. 15 employs a configuration removing switch 1122, replacing parallel-to-serial conversion section 1127 and LDPC-BC coding control section 1128 with parallel-to-serial conversion section 3121 and LDPC-BC coding control section 3124, and further including adder 3122 and delay unit 3123, in LDPC-BC encoder 112 in FIG. 5.

Upon receiving a command signal that commands the output of a parity sequence from LDPC-BC coding control section 3124, parallel-to-serial conversion section 3121 outputs in serial the calculation results accumulated in parallel in adders 1124-1 to 1124-P, to adder 3122 in order from the calculation result of adder 1124-1.

Adder 3122 performs mod 2 addition of the values outputted from parallel-to-serial conversion section 3121 and values outputted from delay unit 3123, and outputs the result as a parity sequence.

RA code, $H_{RAp}$, is formed as shown in FIG. 14, and therefore coding of the RA code is realized by multiplying a transmission information sequence by $H_{RAp}$ as shown in FIG. 15 and then accumulating $P_{RA}$ bits in order.

Even in the case of using an RA code, at the timing of the end of a transmission information sequence, it is possible to output a parity sequence acquired by LDPC-BC coding, so that it is possible to perform LDPC coding of a transmission information sequence of an arbitrary length.

Embodiment 2

The present embodiment will describe an LDPC encoder and LDPC decoder that can improve the LDPC-CC error floor using a parity check matrix having features of both an LDPC-CC code and LDPC-BC code.

Figure 16:
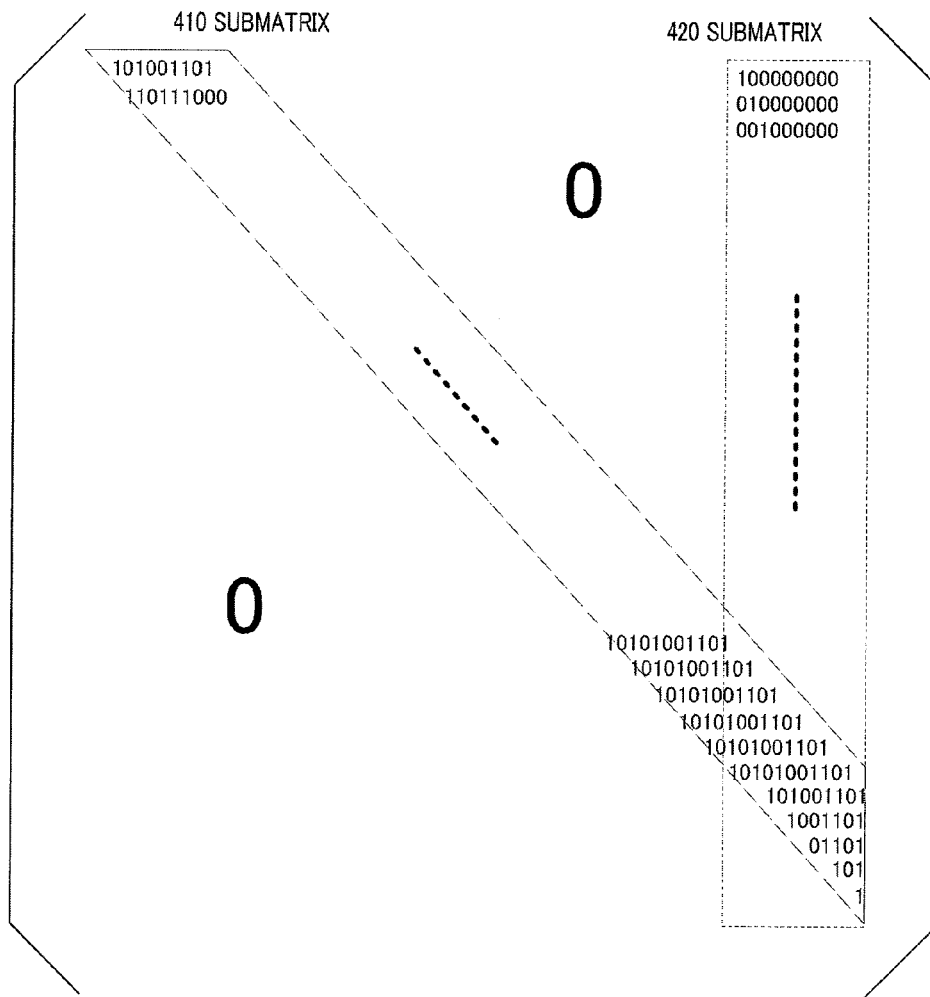
FIG. 16 shows an example of a parity check matrix according to Embodiment 2 of the present invention.

FIG. 16 shows an example of a parity check matrix according to the present embodiment. The positions of weights that are present in parity check matrix 400 in FIG. 16 are only inside submatrix 410 and submatrix 420, and all the other positions are 0's. Submatrix 410 is a trapezoid-shaped matrix along the diagonal line of check matrix 400 and corresponds to a LDPC-CC parity check matrix. Also, submatrix 420 is formed with a plurality of matrixes that locate in the right edge of parity check matrix 400, have weights distributed over the whole transmission information sequence, and therefore corresponds to a LDPC-BC parity check matrix. Here, assume that the number of columns of submatrix 420 is P. With such a matrix, it is possible to provide a parity check matrix having features of both an LDPC-CC code and LDPC-BC code.

Figure 17:
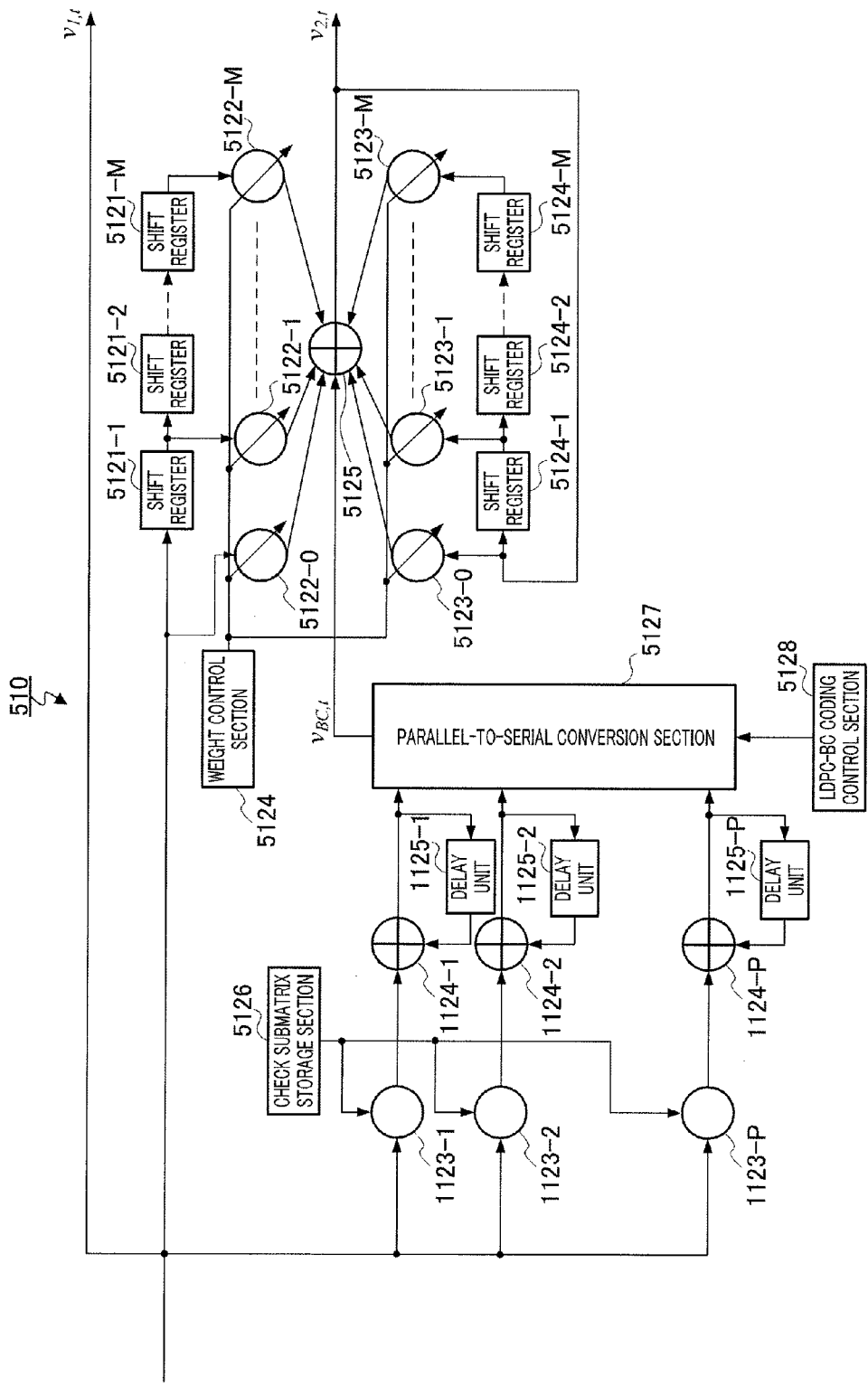
FIG. 17 is a block diagram showing a configuration example of an LDPC encoding section according to Embodiment 2.

FIG. 17 shows a configuration example of an LDPC encoder that performs LDPC-CC coding based on parity check matrix 400. Here, in LDPC encoding section 510 in FIG. 17, the same components as in LDPC-BC encoder 112 in FIG. 5 will be assigned the same reference numerals as in FIG. 5 and their explanation will be omitted.

LDPC encoding section 510 in FIG. 17 is formed with shift registers 5121-1 to 5121-M and 5124-1 to 5124-M, weight multiplying sections 5122-0 to 5122-M and 5123-0 to 5123-M, weight control section 5124, mod 2 adder 5125, weight multiplying sections 1123-1 to 1123-P, adders 1124-1 to 1124-P, delay units 1125-1 to 1125-P, check submatrix storage section 5126, parallel-to-serial conversion section 5127 and LDPC-BC coding control section 5128.

Check submatrix storage section 5126 stores submatrix 420 of parity check matrix 400 and outputs 1 or 0 to weight multiplying sections 1123-1 to 1123-P according to the positions of weights.

In response to a command signal from LDPC-BC coding control section 5128, parallel-to-serial conversion section 5127 performs operations of accumulating in parallel the outputs of adders 1124-1 to 1124-P (i.e. parallel accumulation operation) and outputting in serial the outputs of adders 1124-1 to 1124-P to mod 2 adder 5125 in order from the output of adder 1124-1 (i.e. serial output operation). Here, during the parallel accumulation operation, parallel-to-serial conversion section 5127 always sets the output of parallel-to-serial conversion section 5127 to "0." By this means, during the parallel accumulation operation, the output of parallel-to-serial conversion section 5127 does not influence the calculation result in mod 2 adder 5125.

When the number of transmission information sequences is n and the index of a transmission information sequence that is currently encoded is equal to or less than (n−P), LDPC-BC coding control section 5128 outputs a command signal to make parallel-to-serial conversion section 5127 perform the parallel accumulation operation. By contrast, if the index of the transmission information sequence is greater than (n−P), LDPC-BC coding control section 5128 outputs a command signal to make parallel-to-serial conversion section 5127 perform the serial output operation.

By this means, when the index of a transmission information sequence is greater than (n−P), calculation results between submatrix 420 and the transmission information sequence are added in mod 2 adder 5125.

Thus, by forming the configuration as above, LDPC encoding section 510 can encode an LDPC-CC code based on parity check matrix 400.

Next, an LDPC decoding section that performs LDPC-CC decoding based on parity check matrix 400 will be explained.

Figure 18:
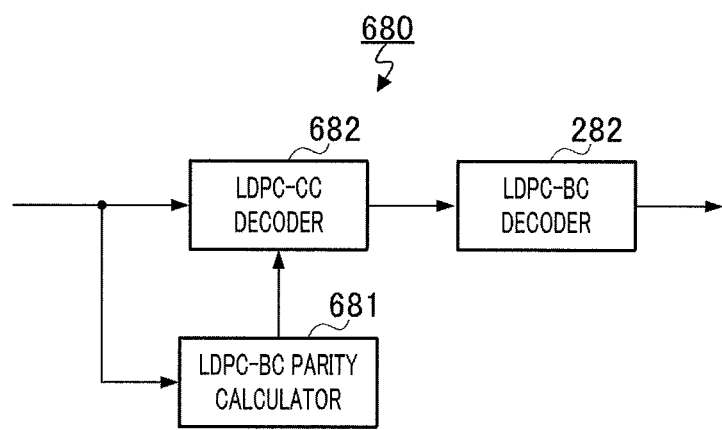
FIG. 18 is a block diagram showing a configuration example of an LDPC decoding section according to Embodiment 2.

FIG. 18 shows a configuration example of an LDPC decoding section that performs LDPC-CC decoding based on parity check matrix 400. LDPC decoding section 680 in FIG. 18 is formed with LDPC-BC parity calculator 681, LDPC-CC decoder 682 and LDPC-BC decoder 282.

LDPC-BC parity calculator 681 performs parity check calculations for P columns according to an input of reception log-likelihood ratio sequence, based on the positions of weights in submatrix 420 of parity check matrix 400. Also, if the index of a reception log-likelihood ratio sequence is greater than (n−P), P parity calculation results (q1 to qp) are sequentially outputted to LDPC-CC decoder 682.

Figure 19:
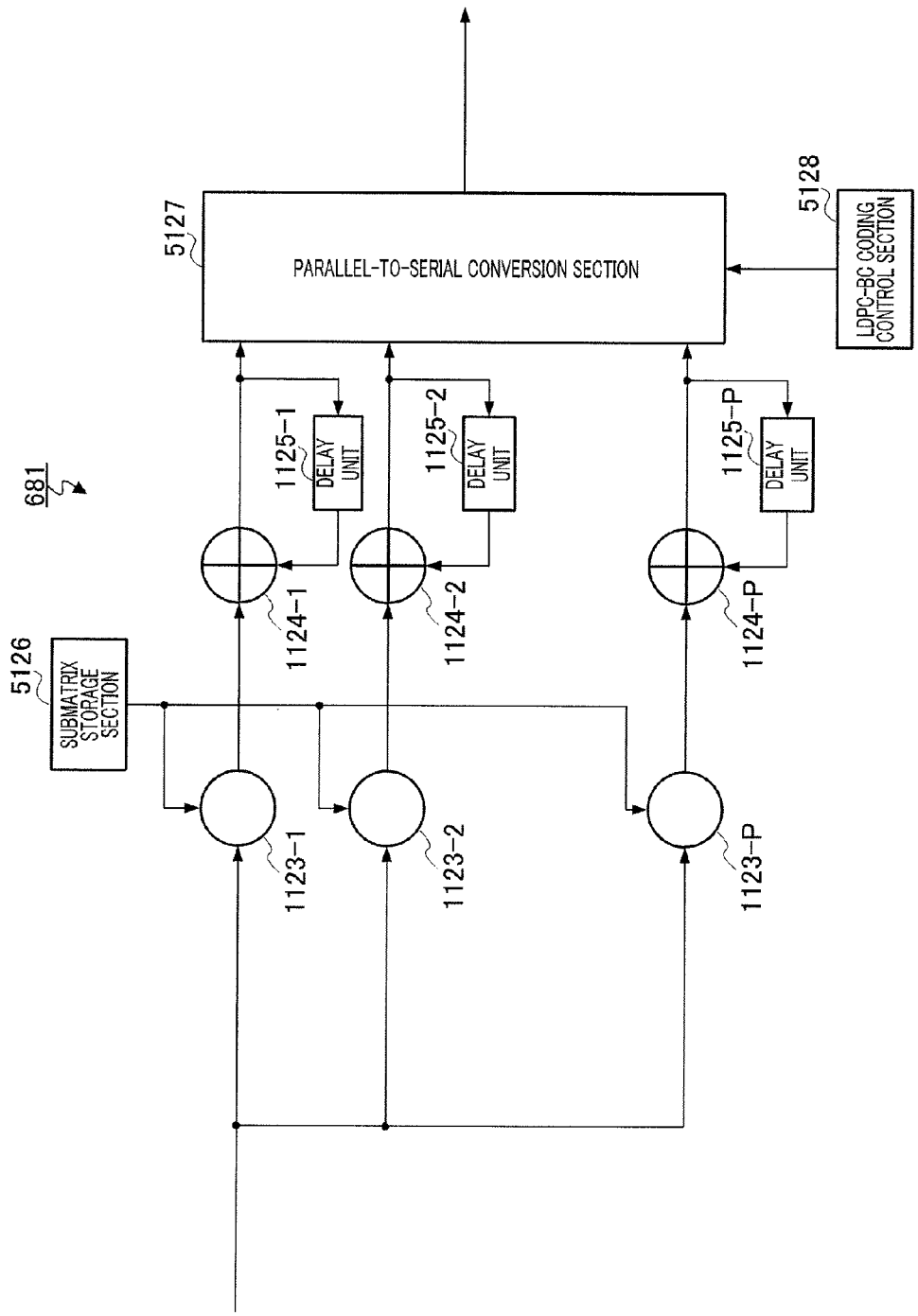
FIG. 19 is a block diagram showing a configuration example of an LDPC-BC parity calculator according to Embodiment 2.

FIG. 19 shows an example of the specific configuration of LDPC-BC parity calculator 681. The configuration of LDPC-BC parity calculator 681 shown in FIG. 19 employs the same configuration as in the LDPC-BC coding part of LDPC-encoding section 510 shown in FIG. 17.

LDPC-CC decoder 682 performs LDPC-CC decoding. To be more specific, if the index of a reception log-likelihood ratio sequence is equal to or less than (n−P) LDPC-CC decoder 682 performs LDPC-CC decoding. By contrast, if the index is greater than (n−P), LDPC-CC decoding is performed using a parity calculation result outputted from LDPC-BC parity calculator 681. An example of LDPC-CC decoding when the index is greater than (n−P), will be explained below.

Figure 20:
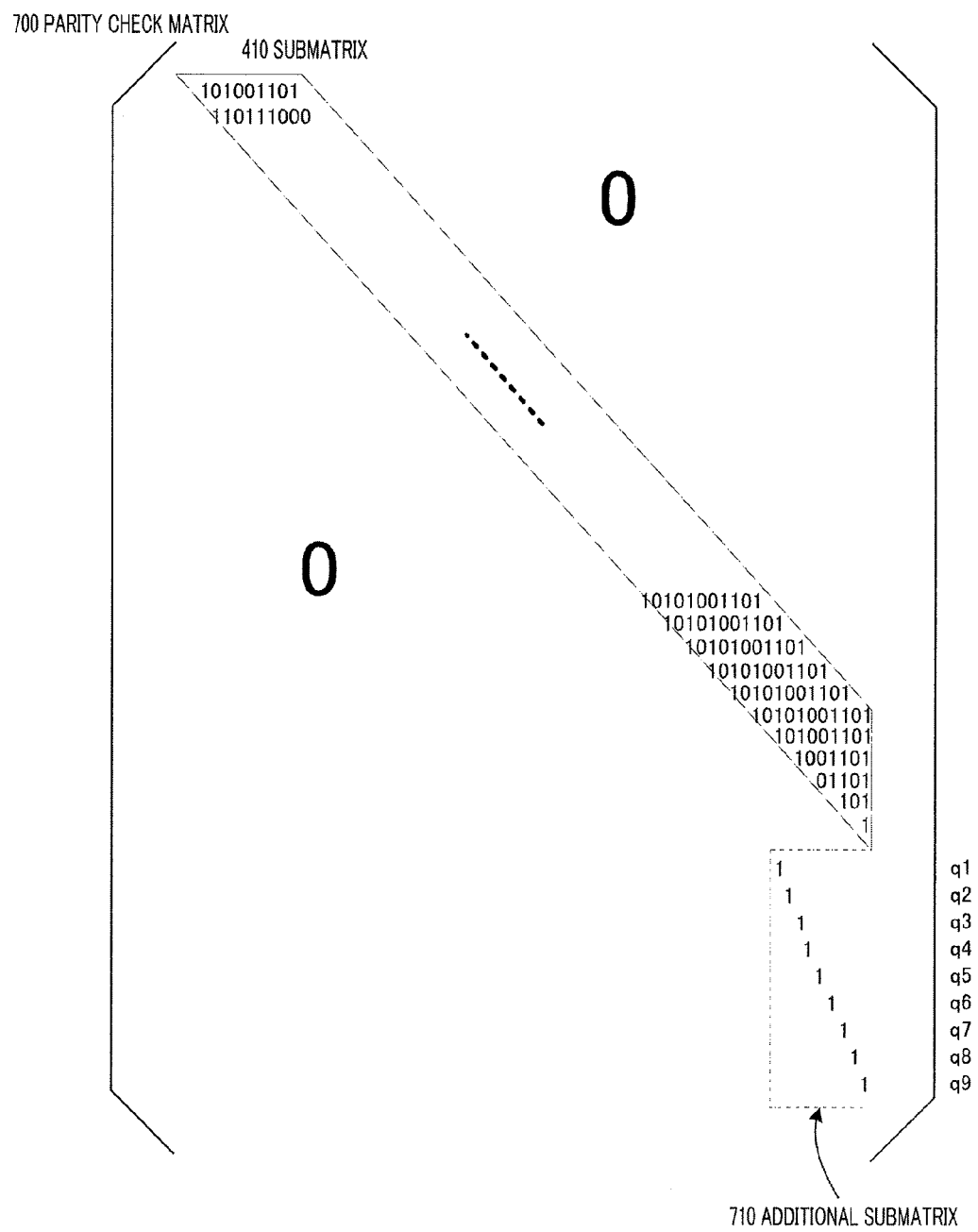
FIG. 20 shows an example of a parity check matrix according to Embodiment 2.

FIG. 20 shows an LDPC-CC parity check matrix used for LDPC-CC decoding when the index is greater than (n−P). LDPC-CC parity check matrix 700 in FIG. 20 is formed with submatrix 410 and additional submatrix 710. When the number of columns of submatrix 420 in FIG. 16 is P, additional submatrix 710 is in the shape of a P×P square matrix (9×9 square matrix in the example in FIG. 20). Also, each row of additional submatrix 710 corresponds to parity bits q1 to qp outputted from LDPC-BC parity calculator 681 in FIG. 19.

Taking into account the weights included in this additional submatrix 710, LDPC-CC decoder 682 performs LDPC-CC decoding. Further LDPC-CC decoder 682 outputs a CC-decoded log-likelihood ratio sequence after LDPC-CC decoding, to LDPC-BC decoder 282.

LDPC-BC decoder 282 performs LDPC-BC decoding processing of the CC-decoded log-likelihood ratio sequence acquired using submatrix 410. Further, LDPC-BC decoder 282 outputs a result of hard decision of the BC-decoded log-likelihood ratio sequence after LDPC-BC decoding.

Thus, LDPC decoding section 680 employs a configuration for performing LDPC-BC decoding after LDPC-CC decoding. Therefore, even if the error floor occurs due to the fact that the minimum LDPC-CC distance is short, LDPC decoding section 680 can correct the error adequately by LDPC-BC decoding.

As described above, according to the present embodiment, LDPC encoding section 510 generates an LDPC-CC codeword sequence using input data and a parity check matrix in which the diagonal elements are the diagonal elements of an LDPC-CC parity check matrix and the rightmost multiple matrixes are an LDPC-BC parity check matrix. By using a parity check matrix having features of both an LDPC-CC code and LDPC-BC code, even if the error floor occurs due to the fact that the minimum LDPC-CC distance is short, it is possible to correct the error by LDPC-BC decoding and improve the error floor.

Variation Example

Figure 21:
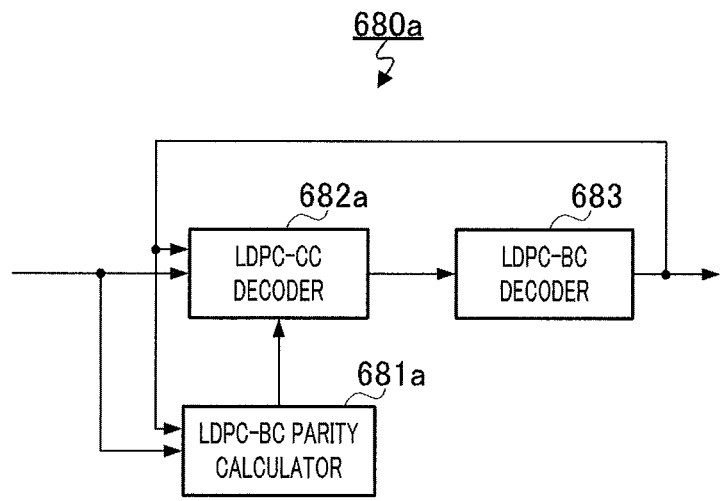
FIG. 21 is a block diagram showing another configuration example of an LDPC decoding section.

Also, FIG. 21 shows another configuration example of an LDPC decoding section. LDPC decoding section 680a shown in FIG. 21 is formed with LDPC-BC parity calculator 681a, LDPC-CC decoder 682a and LDPC-BC decoder 683, and performs LDPC-CC decoding processing and LDPC-BC decoding processing iteratively.

LDPC-CC decoder 682a performs LDPC-CC decoding in the same way as in LDPC-CC decoder 682, and outputs a CC-decoded log-likelihood ratio sequence after LDPC-CC decoding, to LDPC-BC decoder 683.

LDPC-BC decoder 683 performs LDPC-BC decoding processing of the CC-decoded log-likelihood ratio sequence, and outputs a BC-decoded log-likelihood ratio sequence after LDPC-BC decoding, to LDPC-BC parity calculator 681a and LDPC-CC decoder 682a.

Thus, after performing a series of operations similar to in LDPC decoding section 680, LDPC decoding section 680a outputs a BC-decoded log-likelihood ratio sequence outputted from LDPC-BC decoder 683, to LDPC-CC decoder 682a and LDPC-BC parity calculator 681a.

LDPC-BC parity calculator 681a performs an LDPC-BC parity calculation using the BC-decoded log-likelihood ratio sequence as a priori values. Also, LDPC-CC decoder 682a performs LDPC-CC decoding using the BC-decoded log-likelihood ratio sequence as a priori values. By this means, it is possible to perform LDPC-CC decoding processing again using a log-likelihood ratio sequence of gains improved by LDPC-BC decoding, so that it is possible to increase the coding gain acquired by LDPC-CC decoding. As a result, it is possible to further improve the improvement effect of the LDPC-CC error floor.

Figure 22:
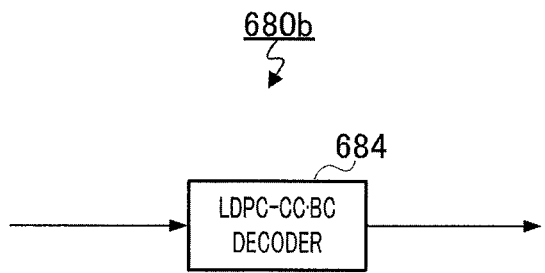
FIG. 22 is a block diagram showing another configuration example of an LDPC decoding section.

Also, FIG. 22 shows another configuration example of an LDPC decoding section. LDPC decoding section 680b shown in FIG. 22 has LDPC-CC and BC decoder 684. LDPC-CC and BC decoder 684 treats LDPC codes given by parity check matrix 400 as one block and decode them collectively. By this means, it is possible to perform LDPC-CC decoding and LDPC-BC decoding by one decoder and provide the improvement effect of the error floor.

LDPC-CC and BC decoder 684 performs decoding using parity check matrix 400 shown in FIG. 16 and the well-known belief propagation algorithm or sum-product algorithm.

Embodiment 3

A case has been described above with Embodiment 1 where an LDPC-BC encoder performs LDPC-BC coding using parity check matrix $H_{BC}$. As an LDPC-BC coding method, it is possible to adopt a method using a generation matrix instead of a method using a parity check matrix. With the present embodiment, an LDPC-BC encoder that performs LDPC-BC coding using a generation matrix will be explained.

Also, similar to the case of decoding an LDPC-BC codeword subjected to LDPC-BC coding using a parity check matrix, it is possible to apply iterative decoding such as belief propagation decoding and sum-product decoding, for decoding an LDPC-BC codeword subjected to LDPC-BC coding using a generation matrix. Therefore, in the following, explanation about the decoding method will be omitted and only the coding method will be explained.

First, a method of deriving generation matrix $G_{BC}$ using parity check matrix $H_{BC}$ will be explained.

In parity check matrix $H_{BC}$ (K×N matrix), when the submatrix corresponding to the information bit part is $H_{BCs}$(K×(N−K) matrix) and the submatrix corresponding to the parity bit part is $H_{BCp}$(K×K matrix), the following equation holds.

[4]

$$[H_{BCs} \mid H_{BCp}]\begin{bmatrix} s \\ p \end{bmatrix} = 0 \quad \text{(Equation 4)}$$

In equation 4, s represents the information sequence and p represents the parity sequence.

These can be expressed on GF(2), and, in this case, equation 4 can be transformed as follows.

[5]

$$H_{BCs}s \oplus H_{BCp}p = 0$$

$$H_{BCp}p = H_{BCs}s$$

$$p = (H_{BCp}^{-1} H_{BCs})s$$

$$p = G_{BC}s \quad \text{(Equation 5)}$$

[6]

$$(G_{BC} = H_{BCp}^{-1} H_{BCs}) \quad \text{(Equation 6)}$$

Here, $G_{BC}$ (K×(N−K) matrix) in equations 5 and 6 is defined as a generation matrix. From equation 5, by multiplying information sequence "s" by generation matrix $G_{BC}$, parity sequence "p" is provided. That is, LDPC-BC coding using generation matrix $G_{BC}$ is realized.

LDPC-BC parity check matrix $H_{BC}$ is a matrix (where each element of the matrix is 0 or 1) on GF(2), and therefore generation matrix $G_{BC}$ acquired by transforming $H_{BC}$ is a matrix on GF(2). Therefore, multiplication of generation matrix $G_{BC}$ and information bit sequence s can be realized only by mod 2 addition (exclusive OR).

(The Configuration of an LDPC-BC Encoder)

Next, an LDPC-BC encoder that performs LDPC-BC coding using above generation matrix $G_{BC}$ will be explained.

Figure 23:
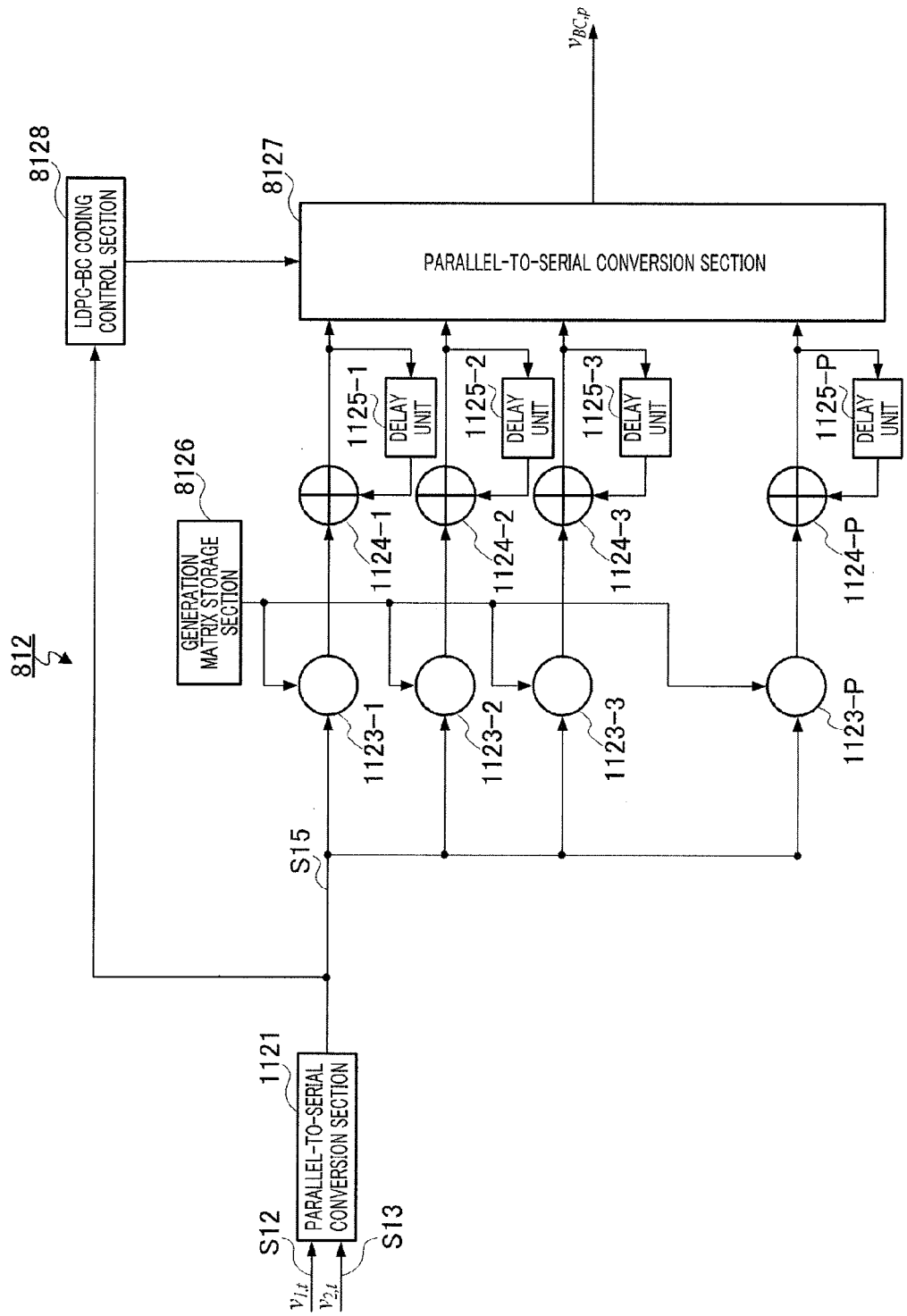
FIG. 23 is a block diagram showing a configuration example of an LDPC-BC encoder according to Embodiment 3 of the present invention.

FIG. 23 shows the configuration of LDPC-BC encoder 812 according to the present embodiment. Here, in LDPC-BC encoder in FIG. 23, the same components as in LDPC-BC encoder 112 in FIG. 5 will be assigned the same reference numerals as in FIG. 5 and their explanation will be omitted.

LDPC-BC encoder 812 is formed with parallel-to-serial conversion section 1121, weight multiplying sections 1123-1 to 1123-P, adders 1124-1 to 1124-P, delay units 1125-1 to 1125-P, generation matrix storage section 8126, parallel-to-serial conversion section 8127 and LDPC-BC coding control section 8128.

Parallel-to-serial conversion section 1121 converts transmission codeword sequences $v_{1,t}$ and $v_{2,t}$ outputted in parallel from LDPC-CC encoder 111, into a serial sequence, and outputs the result to weight multiplying section 1123-1 to 1123-P.

Weight multiplying sections 1123-1 to 1123-P multiplies bits received as input by 1 or 0, according to the positions of weights in a generation matrix stored in generation matrix storage section 8126. Here, it is possible to employ a configuration where weight multiplying sections 1123-1 to 1123-P multiply bits received as input by 1 or 0 directly. Also, it is possible to employ a configuration where weight multiplying sections 1123-1 to 1123-P output input bits to a later stage when the weight is 1, or output 0 when the weight is 0, regardless of input bits.

Adders 1124-1 to 1124-P perform mod 2 addition (exclusive OR calculation) of bits outputted from weight multiplying sections 1123-1 to 1123-P and bits outputted from delay units 1125-1 to 1125-P, and output the results to parallel-to-serial conversion section 8127.

delay units 1125-1 to 1125-P delay input bits by one bit and outputs the results.

Generation matrix storage section 8126 stores a generation matrix for LDPC-BC coding and output a weight of 1 or 0 to weight multiplying sections 1123-1 to 1123-P according to the time.

Parallel-to-serial conversion section 8127 accumulates in parallel parity bits that are output results of adders 1124-1 to 1124-P, converts P accumulated parity bits into serial and output the result as parity sequence $v_{BC,p}$. Here, in response to a command signal from LDPC-BC coding control section 8128, parallel-to-serial conversion section 8127 switches between the timing parity bits are accumulated and the timing the accumulated parity bits are outputted in serial.

By outputting a command signal to parallel-to-serial conversion section 8127, LDPC-BC coding control section 8128 makes parallel-to-serial conversion section 8127 switch between accumulating parity bits and outputting the accumulated parity bits in serial.

To be more specific, at the timing of receiving as input LDPC-CC codeword sequences $(v_{1,0}, v_{2,0})$ that are transmission information sequences, LDPC-BC coding control section 8128 output a command signal to make parallel-to-serial conversion section 8127 accumulate parity bits.

Next, at the timing LDPC-CC codeword sequences that are transmission information sequences have been received as input (i.e. at the timing $v_{1,n}, v_{2,n}$ has been received as input (i.e. parity coding period)), LDPC-BC coding control section 8128 outputs a command signal to make parallel-to-serial conversion section 8127 output the accumulated parity bits in serial as parity sequence $v_{BC,p}$. To be more specific, LDPC-BC coding control section 8128 commands parallel-to-serial conversion section 8127 to output the output of adder 1124-1 at first and subsequently output the outputs of adders up to the output of adder 1124-P. By this command signal, parallel-to-serial conversion section 8127 outputs parity sequence $v_{BC}$.

Here, if a command signal is outputted to output parity sequence $v_{BC,p}$ in serial in the middle of outputting the last column of generation matrix $G_{BC}$ from generation matrix storage section 8126, parallel-to-serial conversion section 1827 immediately outputs the accumulated parity bits in serial as parity bit sequence $v_{BC}$.

At the timing a command signal is outputted to output parity sequence $v_{BC,p}$ in serial, if only the weights up to the weight of the k-th column of generation matrix $G_{BC}$ are outputted from generation matrix storage section 8126 to weight multiplying sections 1123-1 to 1123-P, parity sequence $v_{Bc}$ outputted from parallel-to-serial conversion section 8127 at that timing is equivalent to parity sequence $v_{Bc}$ acquired by coding presuming that the (k+1)-th to $(K_{BC})$-th information bits are all 0's. Here, 2n=k and $k_{BC}>2n$ hold. Accordingly, upon decoding, by performing decoding processing based on this presumption, it is possible to prevent degradation of decoding performance.

First, parallel-to-serial conversion section 1121 in LDPC-BC encoder 812 converts transmission codeword sequences $v_{1,t}$ and $v_{2,t}$ received as input in parallel into serial, and outputs the transmission codeword sequence $v_{1,t}, v_{2,t}$ subjected to serial conversion to weight multiplying sections 1123-1 to 1123-P.

Weight multiplying sections 1123-1 to 1123-P multiplies the transmission codeword sequence $v_{1,t}, v_{2,t}$ by 1 or 0 based on a parity check matrix stored in parity check matrix storage section 8126.

FIG. 24 shows an example of generation matrix $G_{BC}$ in the case of coding rate R=½. Generation matrix $G_{BC}$ in FIG. 24 is a matrix of $P_{BC}$ rows and $K_{BC}$ columns. Each row of generation matrix $G_{BC}$ is associated with the generation polynomial of parity sequence p and each column is associated with information sequence s.

When transmission codeword sequences $v_{1,t}$ and $v_{2,t}$ are received as input (i.e. in the systematic coding period), weights of the columns of generation matrix $G_{BC}$ are outputted from generation matrix storage section 8126 to weight multiplying sections 1123-1 to 1123-P. Here, weights are outputted in order from the first column of generation matrix $G_{BC}$. Next, calculations for parity generation polynomials for the first to P-th columns of generation matrix $G_{BC}$ are implemented in weight multiplying sections 1123-1 to 1123-P, adders 1124-1 to 1124-P and delay units 1125-1 to 1125-P, and the results are outputted to parallel-to-serial conversion section 8127. Also, when the systematic coding period is reported from LDPC-BC coding control section 8128, parallel-to-serial conversion section 8127 accumulates the outputs of adders 1124-1 to 1124-P.

In the parity coding period, LDPC-BC coding control section 8128 reports a command signal indicating the parity coding period, to parallel-to-serial conversion section 8127.

In the parity coding period, parallel-to-serial conversion section 8127 outputs in serial the outputs of adders 1124-1 to 1124-P to LDPC-CC encoder 111 in order from the output of adder 1124-1 associated with the first column of generation matrix $G_{BC}$.

As described above, according to the present embodiment, error correction coding section 110 is provided with LDPC-BC encoder 812 that performs LDPC-BC coding using generation matrix $G_{BC}$. LDPC-BC encoder 112 according to Embodiment 1 calculates parity bits utilizing the fact that parity check matrix $H_{BC}$ includes a lower triangular matrix like LDGM. By contrast with this, according to the present embodiment, parity bits are calculated using generation matrix $G_{BC}$, so that, even if parity check matrix $H_{BC}$ does not include a lower triangular matrix, it is possible to perform LDPC-BC coding.

Also, LDPC-BC encoder 112 according to Embodiment 1 sequentially calculates parity bits using parity check matrix $H_{BC}$ including submatrix $H_{BCp}$ of a lower triangular matrix, and therefore requires a connection wire and switch 1122 for feeding back parity sequence $v_{BC,p}$. By contrast with this, LDPC-BC encoder 112 according to the present embodiment calculates parity bits at once using generation matrix $G_{BC}$, so that a connection wire and switch 1122 for feeding back parity sequence $v_{BC,p}$ are not necessary. Further, according to the present embodiment, LDPC-BC coding for parity sequence $v_{BC,p}$ fed back is not necessary.

Also, although cases have been described above with embodiments where an LDPC-CC code is used as a convolutional code, a convolutional code is not limited to an LDPC-CC code. With the present invention, even a convolutional code that has a relatively longer constraint length and that does not make a parity check matrix low density, can improve the error floor in the same way as above. Especially, in the case of using an LDPC-CC code as a convolutional code, by using iterative decoding such as a sum-product method on the decoding side, it is possible to use a convolutional code of a longer constraint length, so that it is possible to provide higher decoding performance.

Also, cases have been described above with embodiments where an LDPC-BC code or an RA code is used as a block code, a block code is not limited to an LDPC-BC code and RA code. An LDPC-BC encoder presumes that the size (i.e. the number of columns) of submatrix $H_{BCs}$ corresponding to the systematic part of a block code is the maximum possible value of the number of LDPC-CC codeword sequences that are transmission information sequences in a communication system including a transmitting apparatus. By this means, as described above, the LDPC-BC encoder can avoid an occurrence of convolutional codewords of transmission information sequences that are not subject to block coding.

Also, it is possible to implement this coding method and decoding method as software. For example, it is possible to store program that performs the above coding method and communication method in a ROM (Read Only Memory) and operate this program by a CPU (Central Processor Unit).

Also, it is equally possible to store program that operates the above coding method and decoding method in a computer-readable storage medium, record the program stored in the storage medium in a RAM (Random Access Memory), and operate the computer according to the program.

Also, it is needless to say that the present invention is useful in not only wireless communication but also PLC (Power Line Communication), visible light communication and light communication.

The disclosures of Japanese Patent Application No. 2007-224622, filed on Aug. 30, 2007, and Japanese Patent Application No. 2008-219825, filed on Aug. 28, 2008, including the specifications, drawings and abstracts, are incorporated herein by reference in their entireties.

INDUSTRIAL APPLICABILITY

The coding apparatus and decoding apparatus according to the present invention can improve the error floor using features of convolutional codes that can encode and decode an information sequence of an arbitrary length. For example, the coding apparatus and decoding apparatus according to the present invention is useful for, for example, a coding apparatus that performs error correction coding using LDPC codes and a decoding apparatus that decodes a code sequence subjected to LDPC coding.

The invention claimed is:

1. A coding apparatus comprising:
a convolutional encoder that acquires a convolutional codeword sequence by performing convolutional coding of an input sequence; and
a block encoder that acquires a parity sequence by performing block coding of the convolutional codeword sequence and outputs the parity sequence to the convolutional encoder, wherein:
the convolutional encoder acquires a low density parity check convolutional code codeword sequence as the convolutional codeword sequence by performing low density parity check convolutional code coding of the input sequence; and
the block encoder acquires a parity sequence by performing low density parity check block code coding of the low density parity check convolutional code codeword sequence and outputs the parity sequence to the convolutional encoder.

2. The coding apparatus according to claim 1, wherein:
the block encoder comprises an outputter that accumulates in parallel parity bits acquired by the low density parity check block code coding, converts the parity bits accumulated in parallel into serial and outputs the converted parity bits as the parity sequence; and
the outputter switches between a timing of accumulating the parity bits and a timing of outputting in serial the parity bits accumulated, based on a sequence length of the low density parity check convolutional code codeword sequence received as input in the block encoder.

3. The coding apparatus according to claim 2, wherein the timing of accumulating the parity bits is a timing of outputting the low density parity check convolutional code codeword sequence from the convolutional encoder to the block encoder when the input sequence is a transmission information sequence.

4. The coding apparatus according to claim 2, wherein the timing of converting the parity bits into serial and outputting the converted parity bits is a timing the low density parity check convolutional code codeword sequence has been outputted from the convolutional encoder to the block encoder when the input sequence is a transmission information sequence.

5. The coding apparatus according to claim 1, wherein the block encoder performs the low density parity check block code coding using a low density generation matrix.

6. The coding apparatus according to claim 1, wherein the block encoder performs the low density parity check block code coding using a repeat accumulate code.

7. The coding apparatus according to claim 1, wherein, using a structural low density parity check block code as the low density parity check block code, the block encoder sets a number of columns of a constituent identity matrix forming the structural low density parity check block code, equal to or greater than a memory length of a low density parity check convolutional code.

8. The coding apparatus according to claim 1, wherein the block encoder performs the low density parity check block code coding, using a generation matrix acquired from a parity check matrix of a low density parity check block code.

9. A decoding apparatus comprising:
a convolutional decoder that acquires a low density parity check convolutional code decoding sequence by performing low density parity check convolutional code decoding of an input sequence; and
a block decoder that performs low density parity check block code decoding of the low density parity check convolutional code decoding sequence, wherein:
the convolutional decoder acquires a soft decision value after the low density parity check convolutional code decoding, by performing the low density parity check convolutional code decoding of a reception log-likelihood ratio sequence of the input sequence; and
the block decoder performs the low density parity check block code decoding, using the soft decision value after the low density parity check convolutional code decoding.

10. A decoding apparatus comprising:
a convolutional decoder that acquires a low density parity check convolutional code decoding sequence by performing low density parity check convolutional code decoding of an input sequence; and
a block decoder that performs low density parity check block code decoding of the low density parity check convolutional code decoding sequence, wherein:
the convolutional decoder further comprises a hard decider that acquires a soft decision value after low density parity check convolutional code decoding by performing the low density parity check convolutional code decoding of the input sequence and acquires a hard decision value by performing hard decision of the soft decision value after the low density parity check convolutional code decoding; and
the block decoder performs the low density parity check block code decoding using the hard decision value.

11. A decoding apparatus comprising:
a convolutional decoder that acquires a low density parity check convolutional code decoding sequence by performing low density parity check convolutional code decoding of an input sequence; and
a block decoder that performs low density parity check block code decoding of the low density parity check convolutional code decoding sequence, wherein:
the convolutional decoder comprises an error detector that acquires a soft decision value by performing the low density parity check convolutional code decoding of the soft decision value after the low density parity check convolutional code decoding of a reception log-likelihood ratio sequence of the input sequence, acquires a reception codeword sequence by performing hard decision of the soft decision value, performs error detection of the reception codeword sequence per memory length in a low density parity check convolutional code parity check matrix used for the low density parity check convolutional code decoding, and assigns an error label to the reception codeword sequence based on an error detection result; and
the block decoder performs erasure correction decoding of the reception codeword sequence per the memory length, based on the error label.

12. A decoding apparatus comprising:
a convolutional decoder that acquires a low density parity check convolutional code decoding sequence by performing low density parity check convolutional code decoding of an input sequence; and
a block decoder that performs low density parity check block code decoding of the low density parity check convolutional code decoding sequence, wherein:
the convolutional decoder acquires a soft decision value by performing the low density parity check convolutional code decoding of a reception log-likelihood ratio sequence of the input sequence;
the block decoder acquires a soft decision value by performing the low density parity check block code decoding using the soft decision value; and
the convolutional decoder performs the low density parity check convolutional code decoding, using the soft decision value acquired in the block decoder as an a priori value.

13. A non-transitory computer-readable storage medium with an executable coding program stored thereon, wherein the coding program instructs a processor to perform:
acquiring a convolutional codeword sequence by performing convolutional coding of an input sequence; and
acquiring a parity sequence by performing block coding of the convolutional codeword sequence and outputs the parity sequence, wherein:
the acquiring the convolutional codeword sequence includes acquiring a low density parity check convolutional code codeword sequence as the convolutional codeword sequence by performing low density parity check convolutional code coding of the input sequence; and
the acquiring the parity sequence includes acquiring the parity sequence by performing low density parity check block code coding of the low density parity check convolutional code codeword sequence and outputs the parity sequence.

14. A non-transitory computer-readable storage medium with an executable decoding program stored thereon, wherein the decoding program instructs a processor to perform:
acquiring a low density parity check convolutional code decoding sequence by performing low density parity cheek convolutional code decoding of an input sequence; and
performing low density parity check block code decoding of the low density parity check convolutional code decoding sequence, wherein:
the acquiring includes acquiring a soft decision value after the low density parity check convolutional code decoding, by performing the low density parity check convolutional code decoding of a reception log-likelihood ratio sequence of the input sequence; and
the performing includes performing the low density parity check block code decoding, using the soft decision value after the low density parity check convolutional code decoding.

15. A non-transitory computer-readable storage medium with an executable decoding program stored thereon, wherein the decoding program instructs a processor to perform:
acquiring a low density parity check convolutional code decoding sequence by performing low density parity check convolutional code decoding of an input sequence; and
performing low density parity check block code decoding of the low density parity check convolutional code decoding sequence, wherein:
the acquiring further includes acquiring a soft decision value after low density parity check convolutional code decoding by performing the low density parity check convolutional code decoding of the input sequence and acquiring a hard decision value by performing hard decision of the soft decision value after the low density parity check convolutional code decoding; and the performing includes performing the low density parity check block code decoding using the hard decision value.

* * * * *